United States Patent
Kamioka et al.

(10) Patent No.: US 6,930,968 B2
(45) Date of Patent: Aug. 16, 2005

(54) SEMICONDUCTOR LASER DRIVING APPARATUS WITH FILTER TO ATTENUATE ENHANCED FREQUENCY COMPONENT AND OPTICAL DISK APPARATUS INCLUDING THE SAME

(75) Inventors: Yuichi Kamioka, Osaka (JP); Toshiya Akagi, Osaka (JP); Yoshiyuki Miyabata, Kyoto (JP); Yuichi Takahashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 468 days.

(21) Appl. No.: 09/811,033

(22) Filed: Mar. 16, 2001

(65) Prior Publication Data
US 2002/0024909 A1 Feb. 28, 2002

(30) Foreign Application Priority Data
Mar. 17, 2000 (JP) .......................... 2000-077279

(51) Int. Cl.$^7$ .............................................. G11B 7/004
(52) U.S. Cl. ................. 369/59.16; 369/53.3; 369/53.37
(58) Field of Search .......................... 369/59.16, 53.3, 369/53.37, 59.1, 59.14

(56) References Cited

U.S. PATENT DOCUMENTS

| | | | | |
|---|---|---|---|---|
| 4,967,417 A | * | 10/1990 | Yamada ................. | 372/29.015 |
| 5,090,001 A | * | 2/1992 | Ito et al. ................. | 369/44.28 |
| 5,327,411 A | * | 7/1994 | Iwasa et al. ............. | 369/59.12 |
| 5,475,235 A | * | 12/1995 | Phillips et al. ............ | 250/574 |
| 6,011,768 A | * | 1/2000 | Taguchi .................. | 369/116 |
| 6,044,055 A | * | 3/2000 | Hara ....................... | 369/116 |
| 6,088,311 A | * | 7/2000 | Katoh ...................... | 369/47.18 |
| 6,153,063 A | * | 11/2000 | Yamada et al. .......... | 204/192.22 |
| 6,333,909 B1 | * | 12/2001 | Zaima ..................... | 369/116 |
| 6,385,219 B1 | * | 5/2002 | Sonoda .................... | 372/28 |
| 6,477,124 B2 | * | 11/2002 | Carson .................... | 369/53.21 |

FOREIGN PATENT DOCUMENTS

| | | |
|---|---|---|
| JP | 06-243501 | 9/1994 |
| JP | 09-162473 | 6/1997 |

* cited by examiner

Primary Examiner—Gautam R. Patel
(74) Attorney, Agent, or Firm—Snell & Wilmer L.L.P.

(57) ABSTRACT

A semiconductor laser driving apparatus for directing light to an optical disc for recording a recording mark based on a recording current and reproducing the recording mark to generate a reproduction signal. The apparatus includes a reproduction current generation section; a high frequency current generation section for generating a current including a high frequency component for reducing semiconductor laser noise in the reproduction; a recording current generation section, the recording current including a pulse corresponding to the recording mark and including a plurality of multi-pulses; and a current driving section for amplification. The apparatus further includes a filter to attenuate the enhanced high frequency components in the high frequency current and in the enhanced high frequency component; and a switching section for switching the filter so that the enhanced component in the recording current is superposed on at least one of the multi-pulses.

22 Claims, 18 Drawing Sheets

(a)

(b)

FIG.22
(PRIOR ART)
(a) 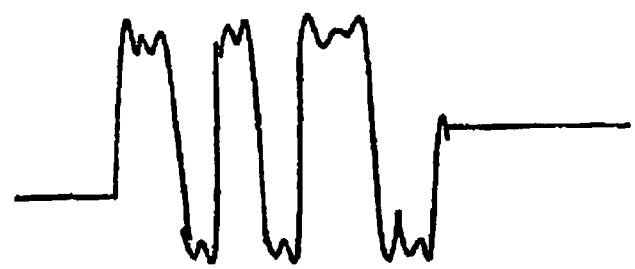
(b) 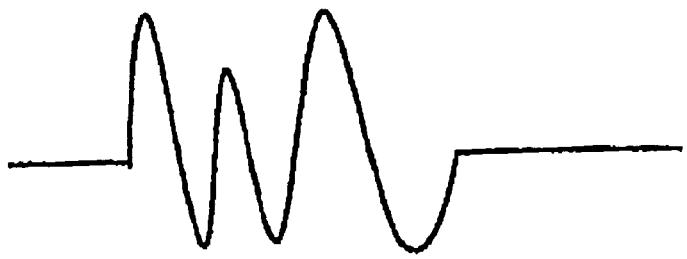

SEMICONDUCTOR LASER DRIVING APPARATUS WITH FILTER TO ATTENUATE ENHANCED FREQUENCY COMPONENT AND OPTICAL DISK APPARATUS INCLUDING THE SAME

BACKGROUND OF THE INVENTION

1. Field of the Invention

The present invention relates to a semiconductor laser driving apparatus used for recording and reproducing data in an optical disc apparatus, and an optical disc apparatus including the same.

2. Description of the Related Art

Recently, an optical disc is expected to be used as a recording medium of video data replacing video tapes, in addition to an external recording medium for a personal computer. Video data encompasses an enormous amount of data. A high recording density is needed to record such an enormous amount of data on a small-diameter optical disc. The following is available as means for achieving a high recording density.

Means 1: introduction of a PWM (pulse width modulation) system, by which information its recorded as the positions of edges of recording marks.

Means 2: introduction of recording correction technology for correcting positions of edges of recording marks so as to reduce a mark edge shift which occurs due to thermal interference between the recording marks at the time of recording.

Means 3: reduction in the level of noise generated in a reproduction system.

For a conventional rewritable optical disc medium, a PPM (pulse position (or phase) modulation) system is generally used, according to which information is recorded as positions of recording marks. According to the PWM system, unlike the PPM system, information is recorded as positions of edges of recording marks. Therefore, one recording mark cat provide two pieces of information. This is advantageous for increasing the recording density. However, it is necessary to precisely control the positions of the edges, which in turn requires precise control of positions of pulses of a recording current for recording the recording marks and also requires precise control of balance of the amount of heat which acts on the recording marks.

FIG. 13 shows recording pulses 133 conventionally used for the PWM system and recording marks 132 which are recorded by the pulses 133 on the optical disc. A recording current 131 includes the pulses 133 for recording the recording marks 132 and a bias power current 136. Each pulse 133 includes a plurality of multi-pulses 134. Each multi-pulse 134 Includes a peak power level 135 and a trough power level 137.

As shown in FIG. 13, each pulse 133 has peak power levels 135 (high level) and trough power levels 137 (low level) appearing alternately. In the case where recording is performed on an optical disc Including a phase shift recording layer, a phase shift phenomenon is utilized to perform recording. More specifically, each mark 132 (i.e., amorphous state) is recorded by the peak power levels 135 of the corresponding pulse 133, and a space (i.e., crystalline state) is recorded by the bias power current 136 between the pulses 133. The trough power levels 137 of each multi-pulse 134 is used to raise the cooling speed of the recording layer.

When the density of the recording marks 132 is increased by the PWM system, each recording mark 132 is shorter than a spot diameter (not shown) of the semiconductor laser. Thermal interference between the recording marks 132 occurs. As a result, the positions of edges of the recording marks 132 deviate from the positions at which the edges should be placed. In order to avoid this, it has been proposed to correct the pulses 133 of the recording current 131 in consideration of the deviation in the positions of edges of the recording marks 132 as described above as means 2.

When the recording marks 132 are shorter than the spot diameter of the semiconductor laser, an amplitude of a reproduction signal generated from the recording marks 132 is restricted by an optical resolution of light emitted from the semiconductor laser and is thus reduced. FIG. 14 is a graph illustrating the relationship between the amplitude C (carrier level) of a reproduction signal and the frequency F of recording marks of different lengths, i.e., a longer recording mark and a shorter recording mark. The shorter recording mark is recorded at a higher density than the longer recording mark. The relationship is obtained by measurement performed on a spectrum analyzer. As shown in FIG. 14. as the length of the recording mark is decreased, the amplitude of the reproduction signal generated from the recording mark is decreased, in proportion to the optical resolution of light emitted from the semiconductor laser. In consideration that it is necessary to obtain a sufficient signal-to-noise ratio oven at a high recording density, reduction of the level of noise included in the reproduction signal is required in correspondence with the reduction in the amplitude of the reproduction signal. The noise included in the reproduction signal from an optical disc includes a semiconductor laser driving current noise NK which is generated in a semiconductor laser driving circuit for driving the semiconductor laser, a semiconductor laser noise NL generated in the semiconductor laser, and a media no,se ND caused by the shape of a groove on the optical disc.

In conventional optical disc apparatuses, the semiconductor laser noise NL occupies a very large part of the noise included in the reproduction signal. In order to improve the quality of high density data recording, it is demanded to provide a semiconductor laser driving apparatus for reducing the semiconductor laser noise NL.

Hereinafter, an exemplary conventional optical semiconductor laser driving apparatus including a semiconductor laser driving apparatus will be described.

FIG. 15 is a schematic diagram illustrating a structure of a conventional optical disc apparatus 1500.

The optical disc apparatus 1300 includes a spindle motor 3 for rotating an optical disc 1, an optical pickup 2 for executing recording of a recording mark on the optical disc 1 or reproduction of the recording mark recorded on the optical disc 1, and a control block 7 for controlling the optical pickup 2 and the motor 3. The control block 7 includes a recording signal processing block 4, a reproduction signal processing block 5, and a central processing block 6. The central processing block 6 includes a laser timing control section 61 and a formatting section 62.

The optical disc apparatus 1500 operates in the following manner.

The optical disc 1 is rotated in a certain direction by the spindle motor 3. The optical pickup 2 receives gate signals A, B, C and D. The gate signals A, B, C and D cause a semiconductor laser (not shown in FIG. 15) in the optical pickup 2 to emit light based on pulses of a recording current. In other words, recording marks are recorded based on the pulses of the recording current. The gate signals A, B, C and D will be described in detail later. The optical pickup 2 also optically detects the recording marks recorded on the optical disc 1, converts the recording marks into electric signals F, G, H, and I, and outputs the electric signals F, G, H and I to the reproduction signal processing block 5.

The central processing block 6 controls the reproduction signal processing block 5 using a control signal J, and controls the recording signal processing block 4 using a control signal K. The central processing block 6 also controls a rotation on speed of the spindle motor 3 using a rotation speed control signal L. The optical disc apparatus 1500 further includes an interface (not shown) for connection with an external device.

FIG. 16 is a schematic diagram illustrating a structure of the optical pickup 2. FIG. 16 mainly shows a portion of the optical pickup 2 for converting an electric signal into an optical signal and converting an optical signal into an electric signal, and portions related thereto.

The optical pickup 2 includes a semiconductor laser 21 for directing light toward the optical disc 1 (FIG. 15) so as to record recording marks on the optical disc 1 based on the recording current or reproduce recording marks recorded on the optical disc 1 based on a reproduction signal. The optical pickup 2 further includes a semiconductor laser driving apparatus 22 for driving the semiconductor laser 21 and a photodetector unit 521 for reproducing the recording marks based on the light from the semiconductor laser 21 which is reflected by the optical disc 1. The photodetector unit 521 includes photodetectors 23 for detecting the reflected light and converting the detected light into a detection signal N, and a head amplifier 24 for generating a reproduction signal based on the detection signal N.

The optical pickup 2 operates as follows.

The semiconductor laser 21 receives a driving current M from the semiconductor laser driving apparatus 22 and converts the driving current M into light.

For recording the recording marks, the semiconductor laser 21 is provided with e recording current which has been modulated into pulses as the driving current M by the semiconductor laser driving apparatus 22.

For generating a reproduction signal for reproducing the recording marks recorded on the optical disc 1, the semiconductor laser 21 is supplied with a reproduction current (DC current) as the driving current M by the semiconductor laser driving apparatus 22. The current K is converted into light and output from the semiconductor laser 21. The light from the semiconductor laser 21 is reflected by the optical disc 1. Depending on whether there is a recording mark or not, the amount, the polarization angle or the phase of the reflected light changes. This change is detected by the photodetector 23 and converted into the detection current N. The detection current N is converted into a voltage by the head amplifier 24 by I–V conversion, and thus becomes a reproduction signal including focus signals F and G and tracking signals H and I. The reproduction signal is supplied to the reproduction signal processing block 5. Then, the reproduction signal processing block 5 executes focus/tracking control. By adding the focus signals F and G and the tracking signals H and I and extracting a high frequency component, pit information corresponding to the recording marks 132 recorded on the optical disc 1 is reproduced.

FIG. 17 is a schematic diagram illustrating a structure of the semiconductor laser driving apparatus 22.

The semiconductor laser driving apparatus 22 includes a recording and reproduction current generation section 518, a high-frequency current generation section 519, and a current driving section 511.

The recording and reproduction current generation section 518 includes current switching blocks 501 through 504, a reproduction power current source 505, a peak power current source 506, a bias power current source 507, and a trough power current source 508, and an addition block 510.

The high frequency current generation section 519 includes a high frequency superposition control section 512, an AC power supply 513 and a capacitor 514. The high frequency current generation section 519 generates a high frequency current including a high frequency component for reducing the level of semiconductor laser noise included in the reproduction signal.

The current switching block 501 switches a reproduction current on or off. The current switching block 502 switches on or off a peak current included in the recording current. The current switching block 503 switches on or off a bias current included in the recording current. The currant switching block 504 switches on or off a trough current included in the recording current.

The reproduction current, the peak current, the bias current and the trough current which are switched on or off by the current switching blocks 501 through 504 are respectively provided by the reproduction power current source 505, the peak power current source 506, the bias power current source 507 and the trough power current source 508. Values of the reproduction current, the peak current, the bias current and the trough current are respectively set by a reproduction power setting signal O, a peak power setting signal P, a bias power setting signal Q and a trough power setting signal R in accordance with predetermined laser powers (reproduction power, peak power, bias power, and trough power).

The gate signals A through D mentioned above are, more specifically, a reproduction power gate signal A input to the current switching block 501, a peak power gate signal B input to the current switching block 502, a bias power gate signal C input to the current switching block 503, and a trough power gate signal D input to the current switching block 504. Whether or not the value settings of the reproduction current, the peak current, the bias current and the trough current is made effective is respectively determined by the gate signals A through D.

The reproduction current, the peak current, the bias current and the trough current generated in this manner are synthesized by the addition block 510 into a recording current having pulses. The recording current is amplified by the current driving section 511 into the driving current M.

The high frequency superposition control block 512 is connected to the addition bloc 510 through the AC power supply 513 and the capacitor 514. For reproduction, the high frequency superposition control block 512 superposes a high frequency current including a high frequency component which is substantially 300 MHz on a reproduction signal for driving the semiconductor laser 21. The high frequency component included in the high frequency current is preferably 300 MHz, which is about 10 times the reproduction frequency band.

The high frequency component, which is substantially 300 MHz, superposed on the reproduction current reduces the semiconductor laser noise NL generated by "mode hopping" and improves the signal-to-noise ratio of the reproduction signal. Whether the superposition is preformed or not (i.e., superposition/non-superposition switching) is controlled by a high frequency superposition gate signal E which is applied to the high frequency superposition control block 512.

The current driving section 511 has a frequency characteristic which enhances a high frequency component included in a high frequency current generated by the high frequency current generation section 519 at the time of reproduction and enhances a high frequency component included in a recording current generated by the recording and reproduction current generation section 518 at the time of recording.

Hereinafter, an operation of the conventional semiconductor laser driving apparatus 22 will be described with reference to FIG. 18.

FIG. 18 it a timing diagram of an optical output from the semiconductor laser 21 (FIG. 16), the reproduction power gate signal A, the peak power gate signal B, the bias power gate signal C. the trough power gate signal D, and the high frequency superposition gate signal E. FIG. 18 also shows a waveform of the optical output (i.e., reproduction/recording current M) from the semiconductor laser 21. In the example shown in FIG. 18. the gate signals A through E are set to be active at a high (H) level.

When the semiconductor laser driving apparatus 22 begins a reproduction operation, the reproduction power gate signal A is placed in an active state (i.e., a high level), and the semiconductor laser 21 starts emitting light based on a reproduction current 1873 (DC signal). Since the high frequency superposition gate signal E is simultaneously placed in an active state, a high frequency current 1875 of 100 MHz or more, for example, in the vicinity of 300 MHz, is superposed on the reproduction current 1873 as the driving signal M of the semiconductor laser 21. Therefore, the semiconductor laser 21 emits light based on a recording pulse current shown in FIG. 18 which is obtained as a result of superposing the high frequency current 1875 on the reproduction current 1873.

For recording, the level of each of the peak power gate signal B, the bias power gate signal C, and the trough power gate signal D changes in accordance with the pattern of the recording marks to be recorded. Based on the peak power gate signal B, the bias power gate signal C, and the trough power gate signal D, a recording current 1674 is corresponding to the pattern of the recording marks to be recorded is generated by the above-described operation of the reproduction power current source 505 (FIG. 17), the peak power current source 506, the bias power current source 507, the trough power current source 508, and the addition block 510. The current driving section 511 enhances the high frequency component included in the generated recording current 1874.

The semiconductor laser 21 emits light having pulses which are substantially the same as those of the recording current 1874, thus recording the recording marks on the optical disc 1 (FIG. 15).

Power values of the reproduction power current source 505, the peak power current source 506, the bias power current source 507 and the trough power current source 508 have the relationship of the reproduction power current source 505<the trough power current source 508<the bias power current source 507<the peak power current source 506. The power values are set in the following manner.

Where currents used for forming the driving current M to be supplied to the semiconductor laser 21 by the reproduction power setting signal O, the peak power setting signal P, the bias power setting signal Q and the trough power setting signal R are respectively currents IO, IP, IQ and IR, the power value of the reproduction power current Source 505 is set so as to correspond to the value of the current IO. The power value of the trough power current source 508 is set so as to correspond to the value of the currents (IO+IR). The power value of the bias power current source 507 is set so as to correspond to the value of the currents (IO+IR+IQ). The power value of the peak power current source 506 is set so as to correspond to the value of the currents (IO+IR+IQ+IP). The power values are set by superposing the currents in this manner.

An optical disc apparatus for recording data on a phase shift recording layer by the PWM system using the above-obtained recording current is described in Nikkei Electronics, No. 7.00 (publication date: Oct. 6, 1997).

The optical disc apparatus 1500 including the semiconductor laser driving apparatus 22 shown in FIG. 17 suffers from the following problems when actually operating.

Problem 1: The shape of the recording marks recorded on the optical disc is not uniform due to dispersion in the composition of the recording layer of the optical disc.

Problem 2: The shape of the recording marks recorded on the optical disc is not uniform due to fluctuations in linear velocity of tracks of the optical disc with respect to the optical pickup occurring during recording.

Problem 3: is the case of high density recording, optimum recording is not realized merely by correcting the positions of the edges of each recording mark. It is also necessary to correct the power value of the recording power for each recording mark.

Problem 4: A high frequency signal superposed on the reproduction signal generates unnecessary radiation of high frequency noise to the outside of the semiconductor laser is driving apparatus.

Problem 5: Provision of a low pass filter for the purpose of reducing the semiconductor laser driving current noise NK results in the waveform of the recording current being less sharp.

The above-mentioned problems will be described below.

<Problem 1>

In the case of an optical disc utilizing a phase shift phenomenon, recording marks are recorded as follows. The temperature of a first portion of the recording layer in which a recording mark is to be recorded is rapidly raised with laser power of more than a certain level, thereby placing the first portion in an amorphous state. The temperature of a second portion of the recording layer in which a recording mark is not to be recorded is gradually raised with laser power of a lower level than that used in the first portion, thereby placing the second portion in a crystalline state. The level of temperature rise which is necessary to realize the amorphous state varies in accordance with parameters including the thermal absorption ratio and thermal diffusion constant.

FIG. 19 shows a shape of a recording mark 132A recorded on a recording layer having a high thermal absorption ratio using the pulses 133 (FIG. 13) of the recording current 131. As shown in FIG. 19, a leading edge 132B of the recording mark 132A is not normally shaped and tapered.

In the case of the PPM system, the information is recorded as the position of each recording mark as described above. Therefore, tapering of the recording mark does not greatly influence the reproduction signal. In the case of the PWM system, by contrast, tapering of the recording mark generates the following inconvenience. The shape of the leading edge 132B is not normal with the positions of the edges being deviated from the intended positions, and thus Jitter is increased at the leading edge 1323. As a result, an error rate of the reproduction signal is raised.

<Problem 2>

When the linear velocity of tracks on the optical disc with respect to the optical pickup is increased due to the fluctuations in the rotation speed of the optical disc, the level of the temperature rise of the recording layer caused by the pulses 133 (FIG. 13) is reduced. As a result, the recording mark 132A shown in FIG. 19 having the tapered leading edge 132B is obtained. Thus, an error rate of the reproduction signal is increased.

<Problem 3>

According to the PWM system, the balance of the amount of heat which acts on the recording marks is precisely controlled by using multi-pulses as described above.

When a 3T mark (T=width of detection window) shown in FIG. 20 is recorded, the following problem occurs. The 3T mark has a pulse width of 3T, which is the shortest possible pulse width realized by 8–16modulation. The pulse width 3T (i.e., the length of the recording mark) is shorter than a diameter DI of a spot of light directed by the semiconductor laser. In an experiment performed by the present inventors, the 3T marks actually recorded were longer than intended. The present inventors found that in order to record a 3T mark properly, it is necessary for a pulse width W2 of a multi-pules 134A for recording the 3T mark to be shorter than a pulse width W1 of a multi-pulse 134 for recording a 4T or longer mark (e.g., a 5T mark shown in FIG. 20).

When the pulse width W2 is shorter, the temperature of the recorded 3T mark itself does not reach a thermal saturation point, As a result, the recorded 3T mark is unstable is terms of shape.

<Problem 4>

It has been reported that a high frequency component (included in a high frequency current) of about 300 MHz to about 450 MHz during a reproduction operation is effective in reducing the semiconductor laser noise NL included in a reproduction signal. A high frequency current including such a high frequency component preferably has the largest possible amplitude. The reason is that as the amplitude of such a high frequency current is larger, the duty of the waveform of light emitted by the semiconductor laser is reduced, namely, the time period in which the semiconductor laser does not emit light is extended. Therefore, interference of the light emitted by the semiconductor laser to an optical disc and the light returning to the semiconductor laser after being reflected by the optical disc can be alleviated. Thus, mode hopping in the semiconductor laser is more unlikely to occur, and the semiconductor laser noise NL included in the reproduction signal is reduced. According to an experiment performed by the present inventors, the amplitude of a high frequency current effective for reducing the semiconductor laser noise NL was 50 mApp at 300 MHz.

However, when a high frequency current of 300 MHz having an amplitude of 50 mApp is transmitted, a loss in the amplitude is generated during the transmission, as a result of which the high frequency current has a smaller amplitude when being input to the semiconductor laser. In order to provide the semiconductor laser with a high frequency current having a larger amplitude, the current value of the high frequency current generated by the high frequency current generation section 519 (FIG. 17) can be increased. However, this increases unnecessary radiation of high frequency noise to the outside of the semiconductor laser driving apparatus, which is a problem with respect to safety standards.

In order to enhance the high frequency component included in the high frequency current at the time of reproduction, the current driving section 511 may be designed to have a frequency characteristic having a frequency peak at 300 MHz. FIG. 21 shows a waveform of a recording current generated when the current driving section 511 has such a frequency characteristic (waveform (b)) in comparison to a waveform of a normal recording current (waveform (a)). The waveform (a) is obtained when the current driving section 511 does not have a frequency characteristic having such a frequency peak. The recording current shown by waveform (b) has excessive overshoot and undershoot respectively at the rising and falling of the pulses. Therefore, it is impossible to provide a recording mark having proper recording characteristics. However, due to restrictions on circuit design or the like, it is very difficult to provide the current driving section 511 with a frequency characteristic which is flat from a low frequency to a high frequency of 300 MHz.

<Problem 5>

Problem 5 occurs when a driving current for driving the semiconductor laser itself includes a noise component (semiconductor laser driving current noise NK), not the semiconductor laser noise NL caused by the semiconductor laser. Since the amplitude of a reproduction signal is reduced as the recording density is increased as described above it is demanded to significantly reduce the level of noise.

When a low pass filter is provided for cutting out noise in a reproduction signal band, the level of noise in the reproduction signal can be reduced in a reproduction operation. FIG. 22 shows a waveform of a recording current which has passed through a low pass filter (waveform (b)) in comparison to a waveform of a normal recording current (waveform (a)). Pulses of the recording current shown by waveform (b) has blunted edges as compared to the edges of the recording current shown by waveform (a). Therefore, the recording sensitivity is lowered.

SUMMARY OF THE INVENTION

According to one aspect of the invention, a semiconductor laser driving apparatus, for driving a semiconductor laser for directing light to an optical disc for recording a recording mark on the optical disc based on a recording current and reproducing the recording mark recorded on the optical disc so as to generate a reproduction signal, includes a reproduction current generation section for generating the reproduction current; a high frequency current generation section for generating a high frequency current including a high frequency component for reducing semiconductor laser noise included in the reproduction signal; a recording current generation section for generating the recording current, the recording current including a pulse corresponding to the recording mark and the pulse including a plurality of multi-pulses; and a current driving section for amplifying the reproduction current and the recording current. The high frequency component included in the high frequency current generated by the high frequency current generation section is enhanced at the time of reproduction on, and the high frequency component included in the recording current generated by the recording current generation section is enhanced at the time of recording. The semiconductor laser driving apparatus further includes a filter for operating so as to attenuate the enhanced high frequency component included in the high frequency current generated by the high frequency current generation section and the enhanced high frequency component included in the recording current generated by the recording current generation section; and a switching section for switching the filter on or off so that the enhanced high frequency component included in the recording current is superposed on at least one of the plurality of multi-pulses included in the pulse of the recording current.

In one embodiment of the invention, the current driving section has a frequency characteristic for enhancing the high frequency component, and the current driving section enhances the high frequency component included in the high frequency current generated by the high frequency current generation section at the time of reproduction and enhances the high frequency component included in the recording current generated by the recording current generation section at the time of recording.

In one embodiment of the invention, the switching section includes a switch connected to the filter and a timing control section for controlling the timing of opening or closing of the switch.

In one embodiment of the invention, the at least one of the plurality of multi-pulse includes a leading multi-pulse.

In one embodiment of the invention, the pulse includes a specific pulse having a specific pattern, and the switching section causes the filter to operate so that the enhanced high frequency component included in the recording current is superposed on the specific pulse.

In one embodiment of the invention, the recording mark includes a 3T mark recorded by 8–16 modulation. The specific pulse includes a 3T pulse corresponding to the 3T mark. The switching section causes the filter to operate so that the enhanced high frequency component included in the recording current is superposed on the 3T pulse.

In one embodiment of the invention, the switching section causes the filter to operate so that the enhanced high frequency component included in the recording current is superposed on a portion of at least one of the plurality of multi-pulses included in the pulse.

In one embodiment of the invention, the switching section causes the filter to operate so that the enhanced high frequency component included in the recording current is superposed on an entirety of at least one of the plurality of multi-pulses included in the pulse.

In one embodiment of the invention, the at least one of the plurality of multi-pulses includes a trailing multi-pulse.

In one embodiment of the invention, the switching section causes the filter to operate so that the enhanced high frequency component included in the recording current is superposed on all of the plurality of multi-pulses included in the pulse.

In one embodiment of the invention, the reproduction current is a DC current.

In one embodiment of the invention, the switching section causes the filter to operate so that the enhanced high frequency component included in the high frequency current is superposed on the reproduction current at the time of reproduction, and causes the filter to operate so that the enhanced high frequency component included in the recording current is attenuated at the time of recording.

In one embodiment of the invention, the high frequency component has a frequency of 100 MHz or higher.

In one embodiment of the invention, the high frequency component has a frequency of 100 MHz or higher and 450 MHz or lower.

In one embodiment of the invention, the high frequency component has a frequency of substantially 300 MHz.

In one embodiment of the invention, the filter includes a high pass filter.

In one embodiment of the invention, the high frequency component has a frequency which is higher than a out-off frequency of the filter.

In one embodiment of the invention, the filter includes a plurality of filter circuits having different frequency characteristics and different impedance values from one another.

In one embodiment of the invention, the switching section selects one of the plurality of filter circuits as a filter which operates based on a linear velocity of the optical disc.

According to another aspect of the invention, an optical disc apparatus includes an optical pickup for recording a recording mark on an optical disc and reproducing the recording mark recorded on the optical disc; a motor for rotating the optical disc; and a control block for controlling the optical pickup and the motor. The optical pickup includes a semiconductor laser for directing light to the optical disc for recording the recording mark on the optical disc based on a recording current and reproducing the recording mark recorded on the optical disc so as to generate a reproduction current, and a semiconductor laser driving apparatus for driving the semiconductor laser. The semiconductor laser driving apparatus includes a reproduction current generation section for generating the reproduction current, a high frequency current generation section for generating a high frequency current including a high frequency component for reducing a semiconductor laser noise included in the reproduction current, a recording current generation section for generating the recording current, the recording current including a pulse corresponding to the recording mark and the pulse including a plurality of multi-pulses, and a current driving section for amplifying the reproduction current and the recording current, The high frequency component included in the high frequency current generated by the high frequency current generation section is enhanced at the time of reproduction, and the high frequency component included in the recording current generated by the recording current generation section is enhanced at the time of recording. The semiconductor laser driving apparatus further includes a filter for operating so as to attenuate the high frequency component included in the high frequency current generated by the enhanced high frequency current generation section and the enhanced high frequency component included in the recording current generated by the current signal generation section, and a switching section for switching the filter on or off so that the enhanced high frequency component included in the recording current is superposed on at least one of the plurality of multi-pulses included in the pulse of the recording current.

In one embodiment of the invention, the current driving section has a frequency characteristic for enhancing the high frequency component, and the current driving section enhances the high frequency component included in is the high frequency current generated by the high frequency current generation section at the time of reproduction and enhances the high frequency component included in the recording current generated by the recording current generation section at the time of recording.

In one embodiment of the invention, the control block includes a linear velocity detection section for detecting a linear velocity of the optical disc. The switching section causes the filter to operate so that the enhanced high frequency component included in the recording current is superposed on at least one of the plurality of multi-pulses included in the pulse based on the linear velocity of the optical disc.

In one embodiment of the invention, the linear velocity detection section detects the linear velocity of the optical disc based on the reproduction current.

In one embodiment of the invention, the linear velocity detection section detects the linear velocity of the optical disc based on a rotation speed of the motor.

In one embodiment of the invention, the linear velocity detection section detects the linear velocity of the optical disc based on a radial position of the optical pickup on the optical disc.

Thus, the invention described herein makes possible the advantages of providing a semiconductor laser driving apparatus for providing stable recording characteristics at the time of high density recording and a reproduction current having a high signal-to-ratio, and an optical disc apparatus including such a semiconductor laser driving apparatus as a result of solving the above-described problems.

These and other advantages of the present invention will become apparent to those skilled in the art upon reading and understanding the following detailed description with reference to the accompanying figures.

BRIEF DESCRIPTION OF THE DRAWINGS

FIG. 22 shows normal recording pulses of a conventional semiconductor laser driving apparatus in comparison to recording pulses of a conventional semiconductor laser driving apparatus obtained by a low pass filter.

DESCRIPTION OF THE PREFERRED EMBODIMENTS

Hereinafter, the present invention will be described by way of illustrative examples with reference to the accompanying drawings.

Figure 1:
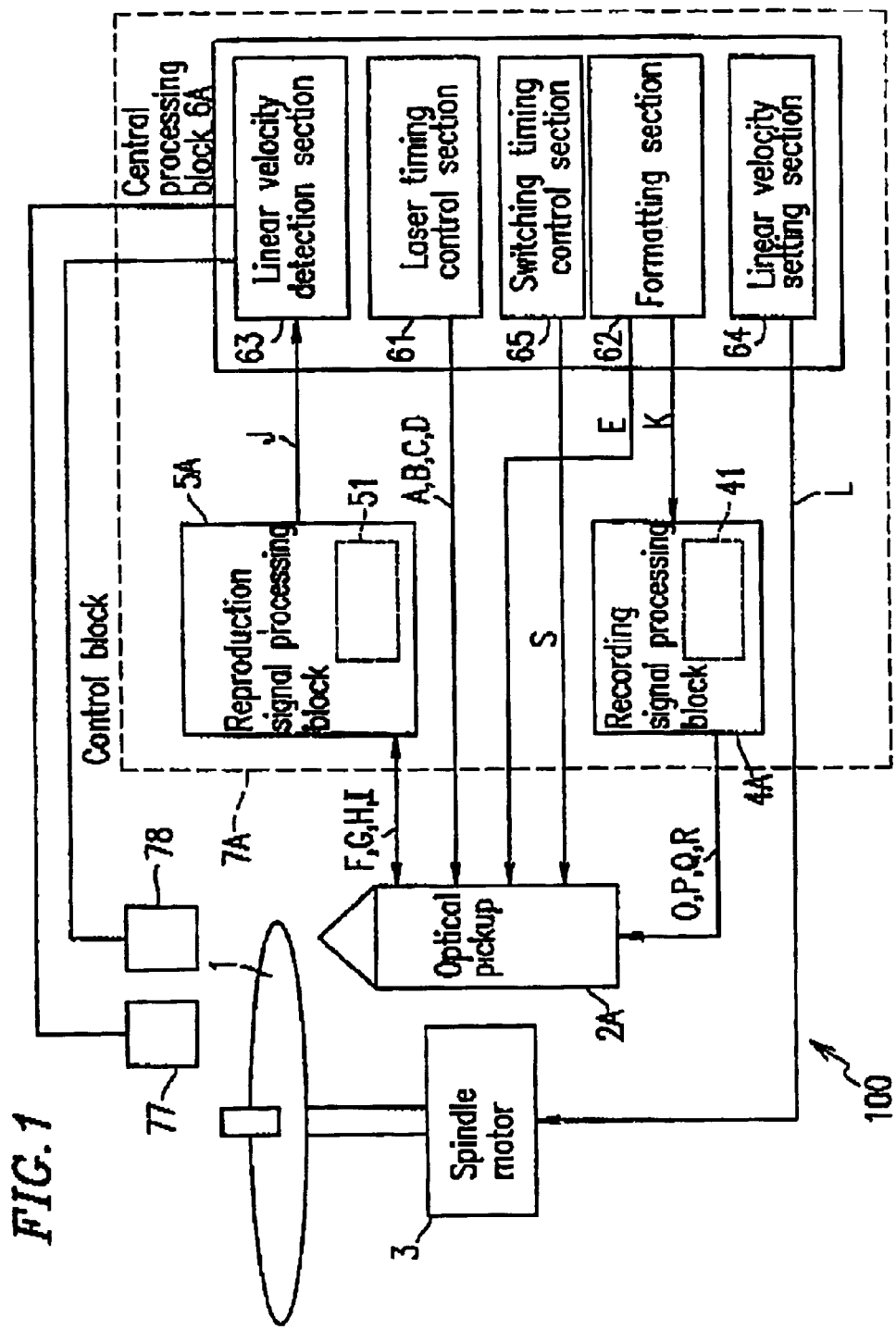
FIG. 1 is a schematic diagram illustrating a structure of an optical disc apparatus according to an example of the present invention.
Figure 15:
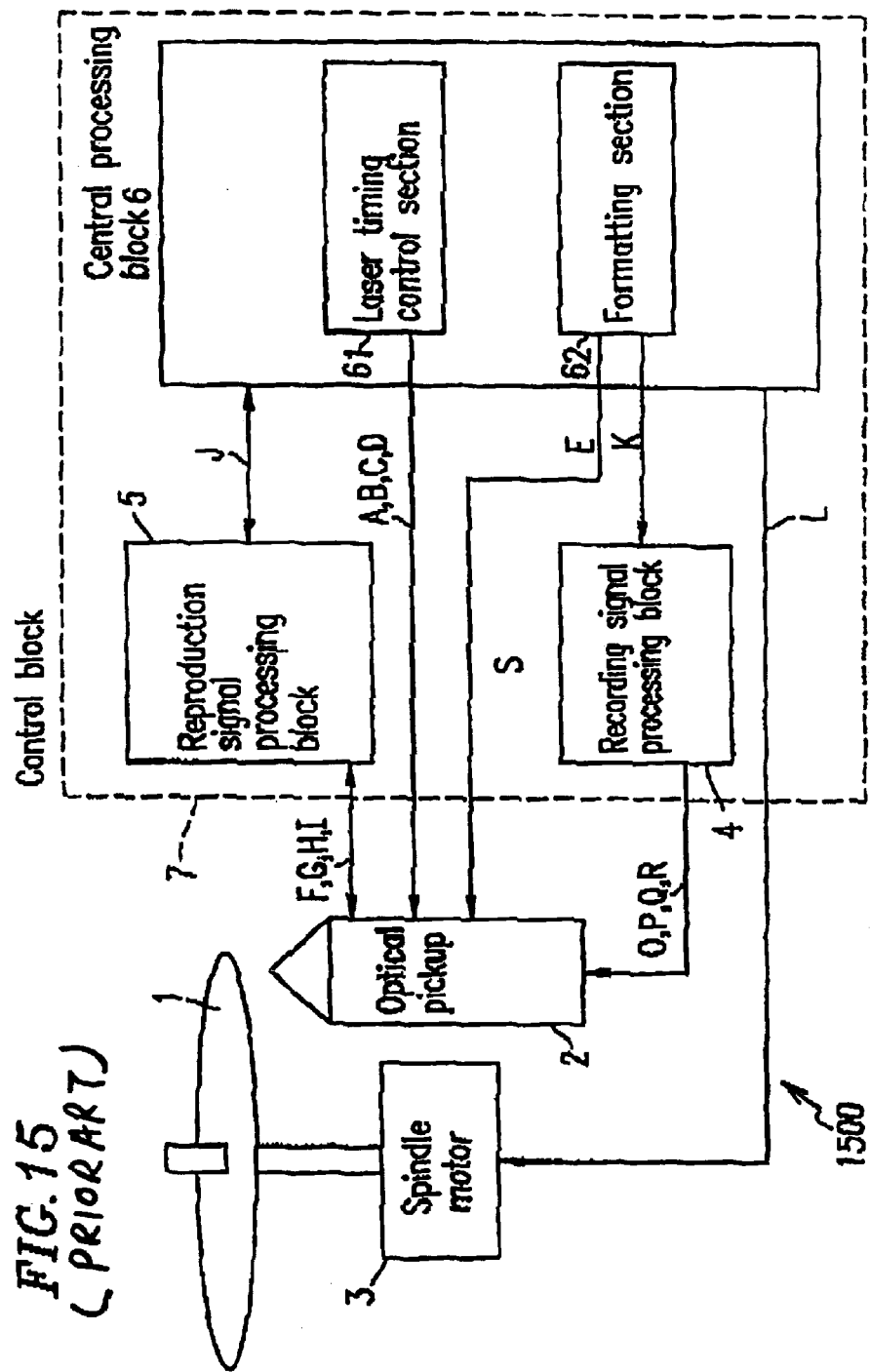
FIG. 15 is a schematic diagram illustrating a structure of a conventional optical disc apparatus.

FIG. 1 is a schematic diagram illustrating a structure of an optical disc apparatus 100 according to an example of the present invention. Identical elements previously discussed with respect to FIG. 15 bear identical reference numerals and the detailed descriptions thereof will be omitted.

The optical disc apparatus 100 includes a spindle motor 3 for rotating an optical disc 1, an optical pickup 2A for recording a recording mark on the optical disc 1 or reproducing the recording mark recorded on the optical disc 1, and a control block 7A for controlling the optical pickup 2A and the motor 3. The control block 7A includes a recording signal processing block 4A, a reproduction signal processing block 5A, and a central processing block 6A. The central processing block 6A includes a linear velocity detection section 63, a laser timing control section 61, a switching timing control section 65, a formatting section 62, and a linear velocity setting section 64. The recording signal processing block 4A includes a data pattern detection section 41. The reproduction signal processing block 5A includes a recording characteristic detection section 51.

Figure 2:
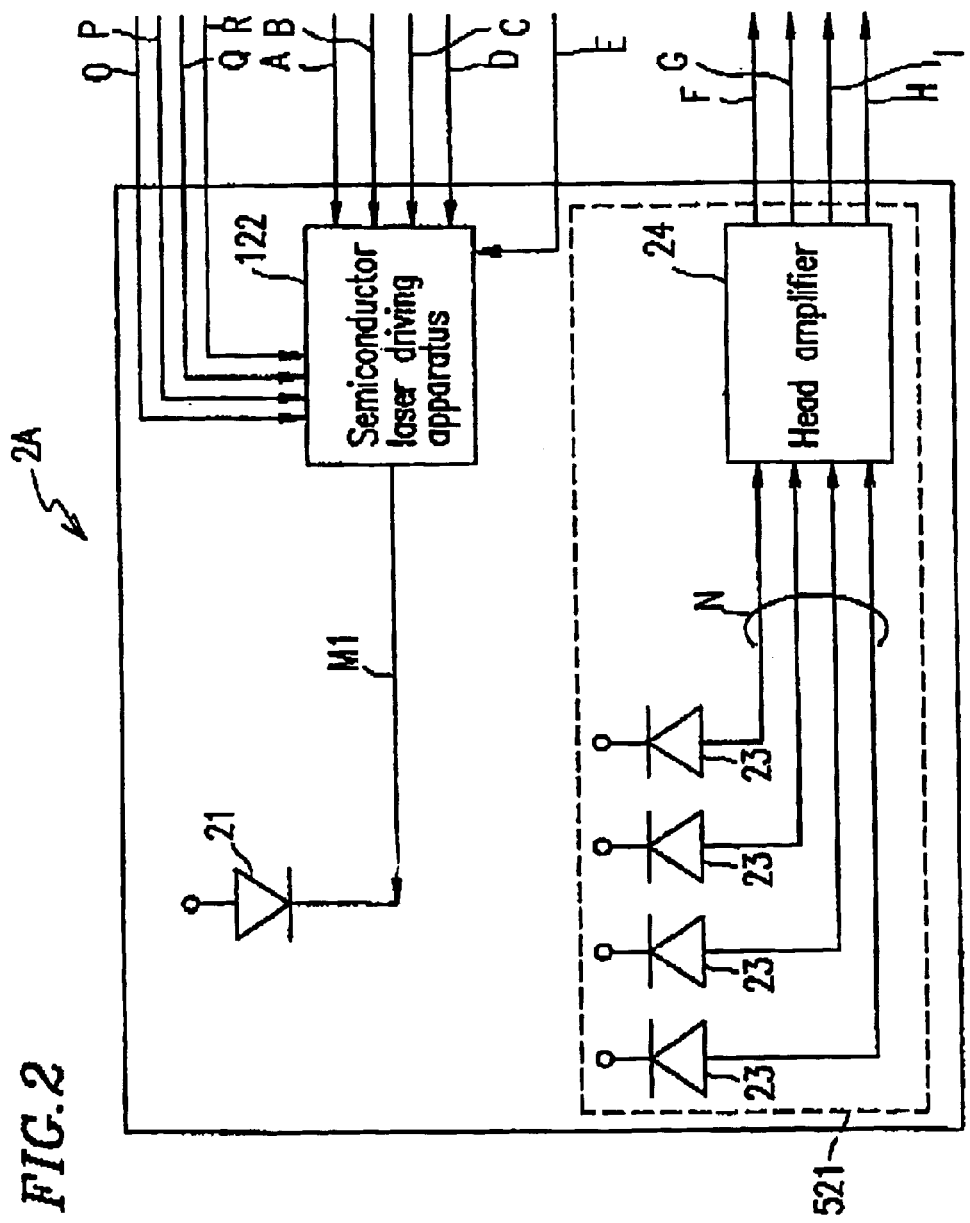
FIG. 2 is a schematic diagram illustrating a structure of an optical pickup included in the optical disc apparatus shown in FIG. 1.
Figure 16:
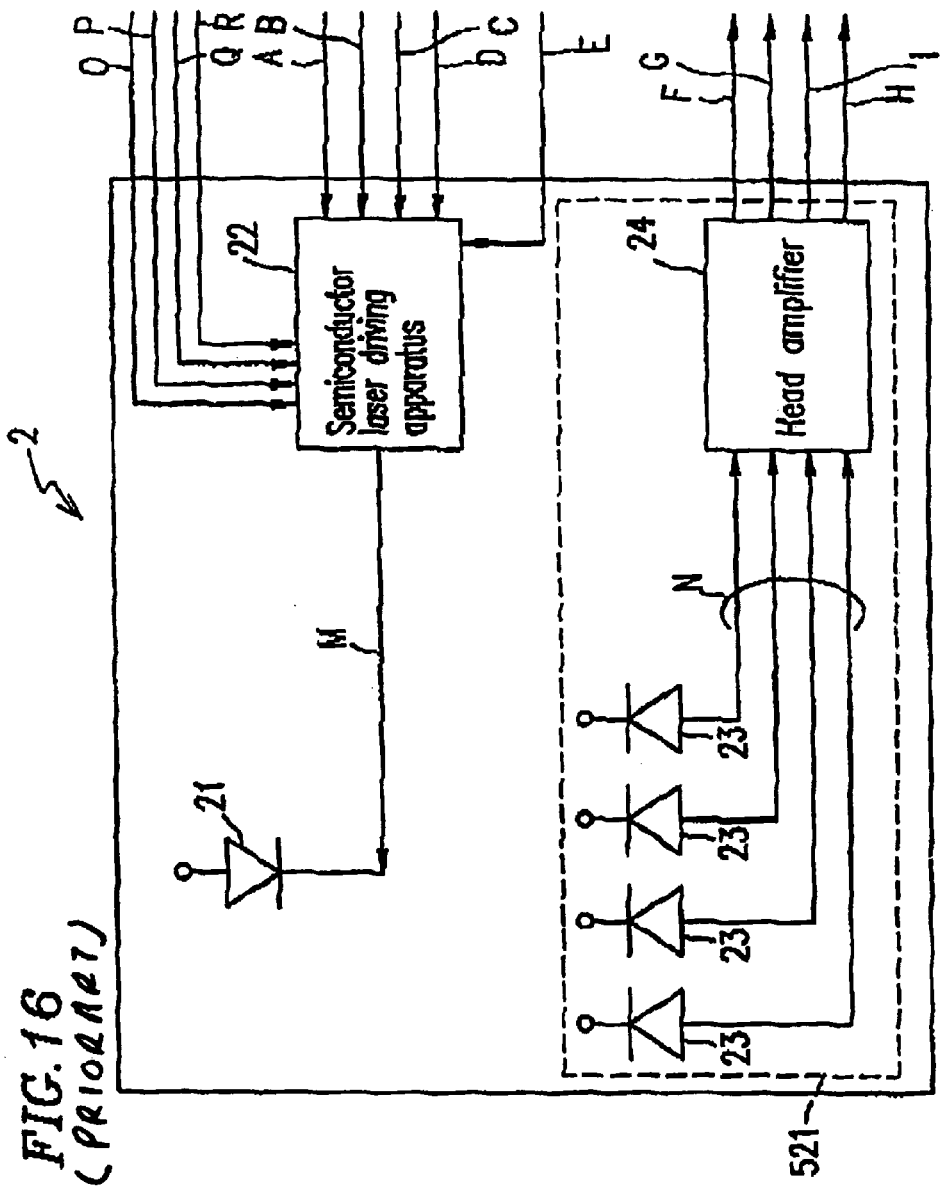
FIG. 16 is a schematic diagram illustrating a structure of an optical pickup included in the conventional optical disc apparatus shown in FIG. 15.

FIG. 2 is a schematic diagram illustrating a structure of the optical pickup 2A. Identical elements previously discussed with respect to FIG. 16 bear identical reference numerals and the detailed descriptions thereof will be omitted.

The optical pickup 2A includes a semiconductor laser 21 for directing light toward the optical disc 1 so as to record the recording marks on the optical disc 1 based on the recording current or reproduce the recording marks recorded on the optical disc 1 based on a reproduction current. The optical pickup 2A further includes a semiconductor laser driving apparatus 122 for driving the semiconductor laser 21 and a photodetector unit 521 for reproducing the recording marks based on the light from the semiconductor laser 21 reflected by the optical disc 1. The photodetector unit 521 includes at least one photodetector 23 for detecting the reflected light and converting the detected light into a detection signal N, and a head amplifier 24 for generating a reproduction signal based on the detection signal N.

Figure 3:
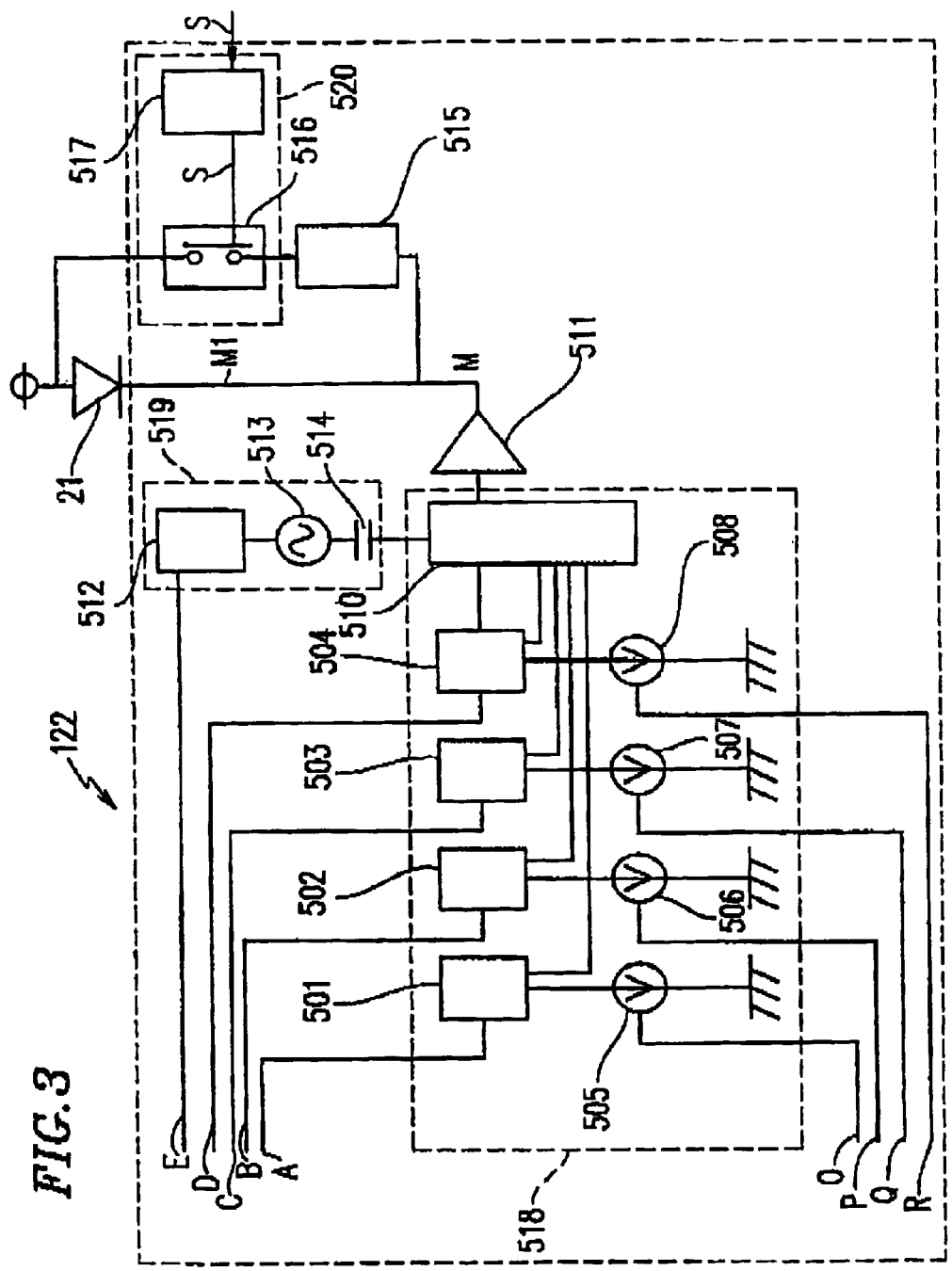
FIG. 3 is a schematic diagram illustrating a structure of a semiconductor laser driving apparatus included in the optical pickup shown in FIG. 2.
Figure 17:
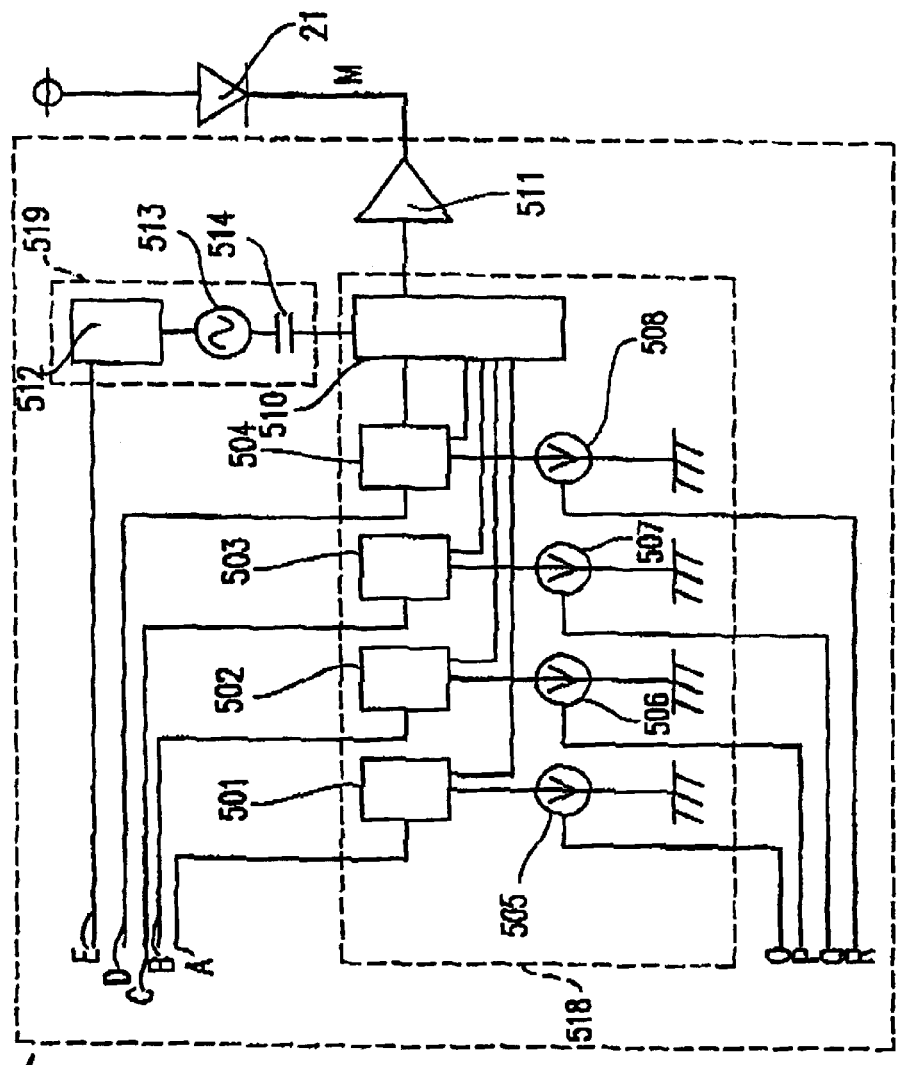
FIG. 17 is a schematic diagram illustrating a structure of a semiconductor laser driving apparatus included in the optical pickup shown in FIG. 16.

FIG. 3 is a schematic diagram illustrating a structure of the semiconductor laser driving apparatus 122. Identical elements previously discussed with respect to FIG. 17 bear identical reference numerals and the detailed descriptions thereof will be omitted.

The semiconductor laser driving apparatus 122 includes a recording and reproduction current generation section 518, a high frequency current generation section 519, a current driving section 511, a filter 515, and a switching section 520.

The recording and reproduction current generation section 510 includes current switching blocks 501 through 504, a reproduction power current source 505, a peak power current source 506, a bias power current source 507, and a trough power current source 508, and an addition block 510.

The high frequency current generation section 519 includes a high frequency superposition control section 512, an AC power supply 513 and a capacitor 514. The high frequency current generation section 519 generates a high frequency current including a high frequency component for reducing the level of a semiconductor laser noise included in the reproduction current. The switching section 520 includes a switch 516 and a timing control section 517, The current switching block 501 switches a reproduction current on or off. The current switching block 502 switches on or off a peak current included in the recording current. The current switching block 503 switches on or off a bias current included in the recording current. The current switching block 504 switches on or off a trough current included in the recording current.

The reproduction current, the peak current, the bias current and the trough current which are switched on or off by the current switching blocks 501 through 504 are respectively provided by the reproduction power current source 505, the peak power current source 506, the bias power current source 507 and the trough power current source 508. Values of the reproduction current, the peak current, the bias current and the trough current are respectively set by a reproduction power setting signal O, a peak power setting signal P, a bias power setting signal Q and a trough power setting signal R in accordance with predetermined laser powers (reproduction power, peak power, bias power, and trough power).

The gate signals A through D are a reproduction power gate signal A input to the current switching block 501, a peak power gate signal B input to the current switching block 502, a bias power gate signal C input to the current switching block 503, and a trough power gate signal D input to the current switching block 504. Whether or not the value settings of the reproduction current, the peak current, the bias current and the trough current is made effective is respectively determined by the gate signals A through D.

The reproduction current, the peak current, the bias current and the trough current generated in this manner are synthesized by the addition block 510 into a recording current having pulses. The recording current is amplified by the current driving section 511 into the driving current M.

The high frequency superposition control block 512 is connected to the addition block 510 through the AC power supply 513 and the capacitor 514. For reproduction, the high frequency superposition control block 512 superposes a high frequency current including a high frequency component which is substantially 300 MHz on a reproduction signal for driving the semiconductor laser 21.

The high frequency component, which is substantially 300 MHz, superposed on the reproduction current reduces the semiconductor laser noise NL generated by mods hopping and improves the signal-to-noise ratio of the reproduction signal. Whether the superposition is performed or not (i.e., superposition/non-superposition switching) is controlled by a high frequency superposition gate signal E which is applied to the high frequency superposition control block 512.

The current driving section 511 has a frequency characteristic which enhances a high frequency component included in a high frequency current generated by the high frequency current generation section 519 at the time of reproduction, and enhances a high frequency component included in a recording current generated by the recording and reproduction current generation section 518 at the time of recording.

Unlike the conventional semiconductor laser driving apparatus 22, the semiconductor laser driving apparatus 122 according to the present invention includes the filter 515, and the switching section 520 including the switch 516 and the timing generation section 517 for supplying the switch 516 with a switch timing signal S for switching the switch 516 on or off.

The filter 515 operates so as to attenuate a high frequency component included in the high frequency current enhanced by the current driving section 511 and a high frequency component included in the recording current enhanced by the current driving section 511. The switching section 520 causes the filter 515 to operate so that the high frequency component included in the recording current enhanced by the current driving section 511 is superposed on at least one of a plurality of multi-pulses included in the recording current.

The switch 516 is placed is an open state when the switch timing signal S is at a high level (H) and is placed in a through (shortcircuited) state when the switch timing signal S is at a low level (L). A state where the filter 515 has a high frequency component superposition action on the driving current M (a recording current in a recording operation and a reproduction current is a reproduction operation) and a state where the filter 515 does not have such an action is switched by the switch 516.

Figure 4:
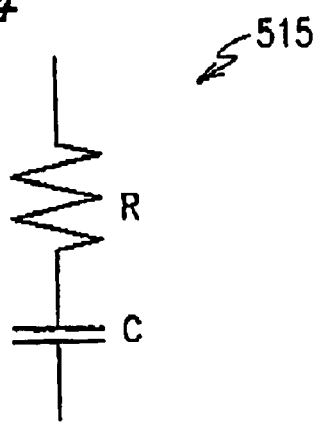
FIG. 4 is a schematic diagram illustrating a structure of a filter in the semiconductor laser driving apparatus shown in FIG. 3.

As shown in FIG. 4, the filter 515 includes a high pass filter including a resistor and a capacitor. When the switch 516 is in a shortcircuited state (i.e., the switch timing signal S is at a low level), a current having a frequency component equal to or higher than a cut-off frequency FC (i.e., $1/(2\Pi RC)$) passes through the filter 515 and thus bypasses the semiconductor laser 21. when the switch 516 is in an open state (i.e., the switch timing signal S is at a high level). a current having any frequency component in any band including the frequency component equal to or higher than the cut-off frequency FC passes through the semiconductor laser 21. The cut-off frequency FC is determined by a resistance R of the resistor and a capacitance C of the capacitor of the filter 515.

Figure 5:
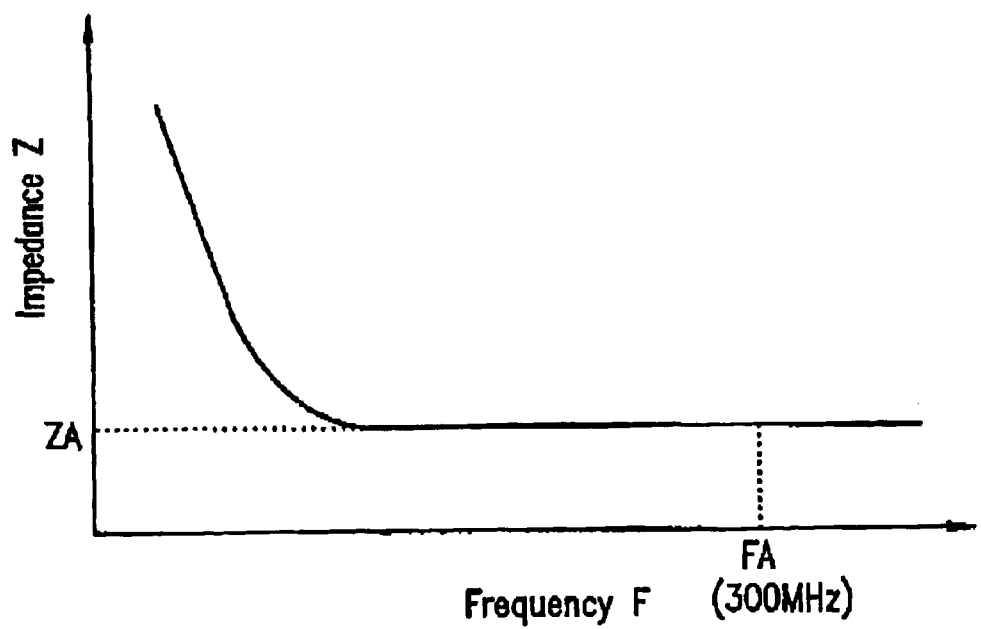
FIG. 5 is a graph illustrating a frequency characteristic of the filter shown in FIG. 4.

FIG. 5 is a graph illustrating an example of a frequency characteristic of the filter 515 (relationship between the impedance Z and the frequency F). At a given frequency level, as the impedance of the filter 515 is decreased, the amount of the current which passes through the filter 515 is increased and thus the amount of the current which passes through the semiconductor laser 21 is decreased.

For reproduction, the semiconductor laser driving apparatus 22 supplies the semiconductor laser 21 with a reproduction current (DC current). For recording, the semiconductor laser driving apparatus 22 supplies the semiconductor laser 21 with a recording current having pulses in correspondence with the pattern of the recording marks (i.e., data) to be recorded.

Hereinafter, an operation of the semiconductor laser driving apparatus 122 will be described with reference to FIG. 6.

Figure 6:
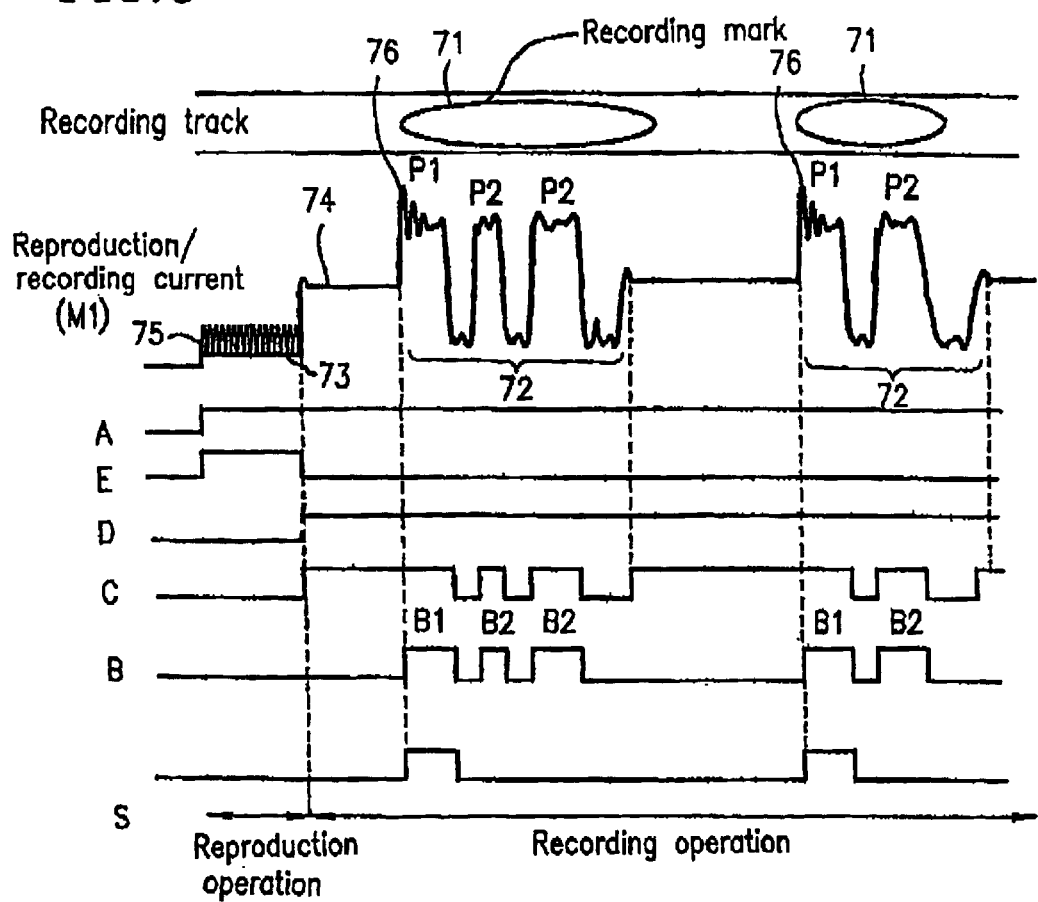
FIG. 6 is a timing diagram of control signals used for driving the semiconductor laser driving apparatus according to the present invention, which also shows resulting recording pulses and recording marks.

FIG. 6 is a timing diagram of an optical output from the semiconductor laser 21 (FIG. 3), and the reproduction power gate signal A, the peak power gate signal B, the bias power gate signal C, the trough power gate signal A, the high frequency superposition gate signal E, and a switch timing signal S. FIG. 6 also shows a waveform of the optical output (i.e., reproduction/recording current) from the semiconductor laser 21. The waveform of the optical output is substantially the same as that of the driving current M1 including the high frequency component superposed by the filter 515 (FIG. 3). In this example, it is assumed that, for example, a signal band necessary for reproducing the recording marks recorded on the optical disc 1 (FIG. 1) is 20 MHz or less, a maximum modulation frequency of the recording current is 60 MHz, and the high frequency superposition frequency is 300 MHz.

Figure 18:
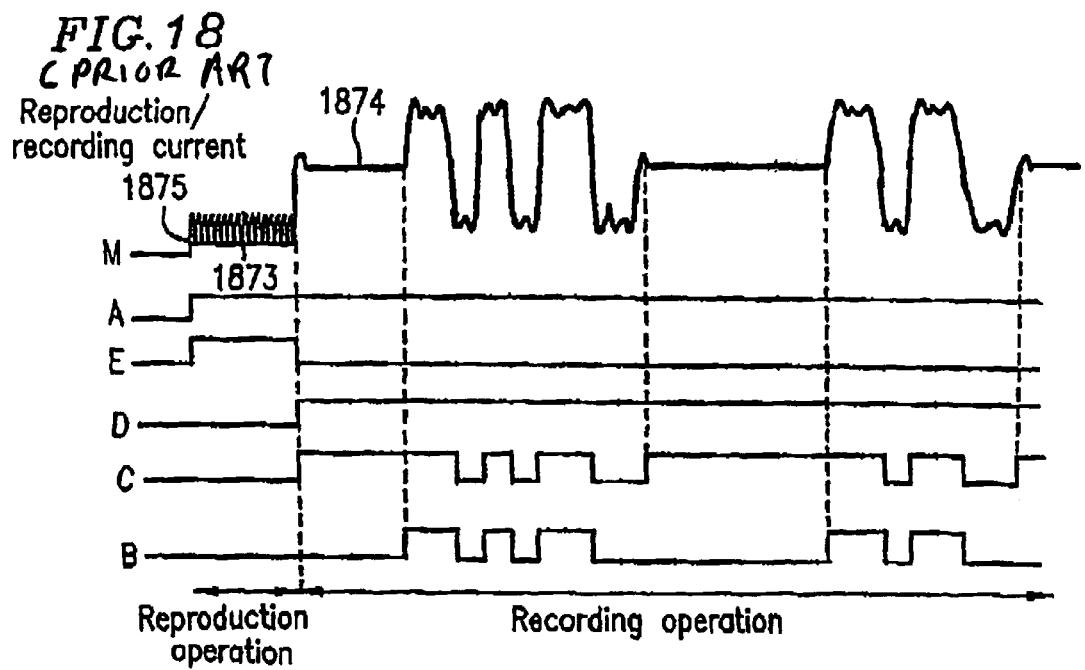
FIG. 18 is a timing chart of control signals used for driving a conventional semiconductor laser driving apparatus.
Figure 19:
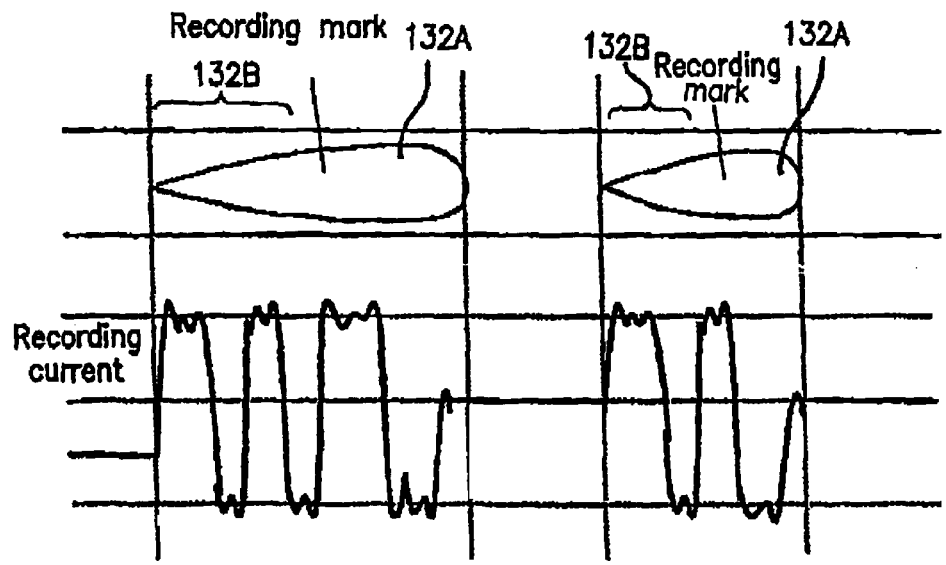
FIG. 19 shows recording marks and a waveform of recording pulses in a conventional semiconductor laser driving apparatus.
Figure 20:
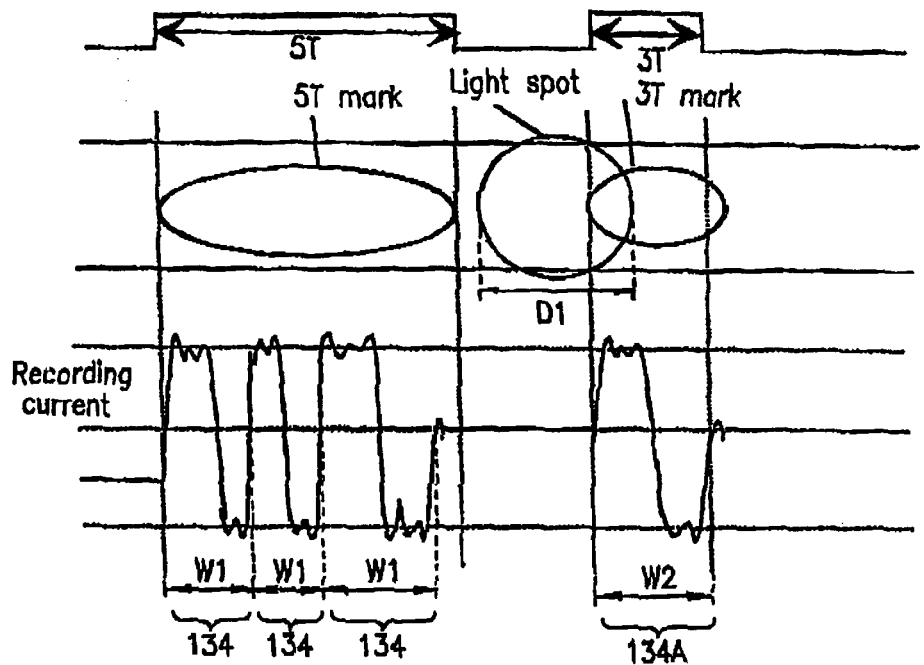
FIG. 20 shows recording marks and a waveform of recording pulses in a conventional semiconductor laser driving apparatus at the time of high density recording.
Figure 21:
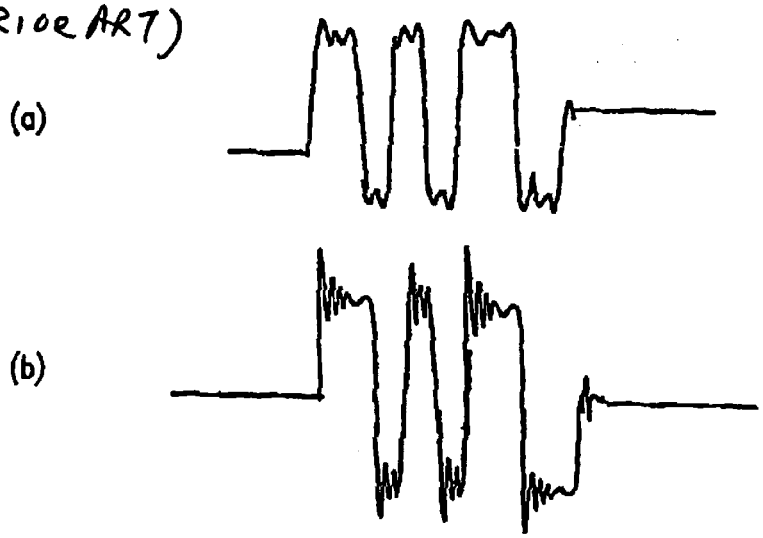
FIG. 21 show normal recording pulses of a conventional semiconductor laser driving apparatus in comparison to recording pulses of a conventional semiconductor laser driving apparatus having a frequency peak.

The operation of the semiconductor laser driving apparatus 122 is fundamentally the same as that of the conventional semiconductor laser driving apparatus 22 described with reference to FIG. 18 up until the current driving section 511 outputs a driving current M. In this example, the gate signals A through E are set to be active at a high (H) level.

When the semiconductor laser driving apparatus 122 begins a reproduction operation, the reproduction power gate signal A is placed in an active state, and the semiconductor laser 21 starts emitting light based on a reproduction current 73 (DC signal). Since the high frequency superposition gate signal E is simultaneously placed in an active state, a high frequency current 75 of 100 MHz or more, for example, in the vicinity of 300 MHz, is superposed on the reproduction current 73 as the driving current M1 of the semiconductor laser 21. Therefore, the semiconductor laser 21 emits light based on a recording pulse current shown is FIG. 6 which is obtained as a result of superposing the high frequency current 75 on the reproduction current 73.

For recording, the level of each of the peak power gate signal B, the bias power gate signal C, and the trough power gate signal D changes in accordance with the pattern of the recording marks to be recorded. Based on the peak power gate signal B, the bias power gate signal C, and the trough power gate signal D, a recording current 74 corresponding to the pattern of the recording marks to be recorded is generated by the above-described operation of the reproduction power current source 505 (FIG. 3), the peak power current source 506, the bias power current source 507, the trough power current source 508, and the addition block 510. The current driving section 511 enhances the high frequency component included in the generated recording current 74.

The filter 515 operates to attenuate the high frequency component included in the recording current 74 enhanced by the current driving section 511. The switching section 520 causes the filter 515 to operate so that the high frequency component included in the recording current 74 enhanced by the current driving section 511 is superposed on at least one of a plurality of multi-pulses included in the recording current 74, as described is detail hereinafter.

With reference to FIG. 6, the recording current 74 has pulses 72 respectively corresponding to recording marks 71. Each pulse 72 includes a plurality of multi-pulses P1 and P2. "P1" indicates a leading multi-pulse among the plurality of multi-pulses. "P2" indicates multi-pulses other than the leading multi-pulse among the plurality of multi-pulses.

As shown in FIG. 6, a leading pulse B1 of the peak power gate signal B (corresponding to the leading multi-pulse P1 of the recording current 74) is detected. Simultaneously with generation of the leading pulse B1, the signal S is switched to a high level. Thus, the switch 516 is placed in an open state, and therefore currents having frequency components in all of the bands including the frequency component higher than the cut-off frequency FC pars through the semiconductor laser 21. As a result, a high frequency component 76 enhanced by the current driving section 511 is superposed on the multi-pulse P1 corresponding to the leading pulse B1 of the peak power gate signal 1 (referred to as an "overshoot"). In this specification, a high frequency component refers to a frequency component which is higher than the cut-off frequency of the filter 515. Also in this specification, the frequency level of the high frequency component is higher than the frequency level of pulses B1 and B2 of the peak power gate signal B.

When the pulses B2 (corresponding to the non-leading pulses P2 of the recording current 74) are generated, the switch timing signal S is at a low level. Thus, the switch 516 is in a shortcircuited state, and therefore a current having a high frequency component passes through the filter 515 and bypasses the semiconductor laser 21. Therefore, the above-mentioned overshoot is not generated for the multi-pulses P2 corresponding to the pulses B2. As shown in FIG. 5, the level of impedance corresponding to frequency FA (300 MHz) (indicated by "ZA") is sufficiently small to avoid overshoot.

As described above, according to the present invention, the switching section 520 causes the filter 515 to operate so that the high frequency component 76 included in the recording current enhanced by the current driving section 511 is superposed on the leading multi-pulse P1 of the plurality of multi-pulses, based on the switch timing signal S. The switching section 520 also causes the filter 515 so that the high frequency component 76 included in the recording current enhanced by the current driving section 511 is attenuated in correspondence with the non-leading multi-pulses P2, based on the switch timing signal S. Accordingly, overshoot is not generated for the non-leading multi-pulses P2.

A driving current M1 obtained as a result of frequency characteristic adjustment is supplied to the semiconductor laser 21 (FIG. 3). The semiconductor laser 21 emits light having pulses which are substantially the same as those of the recording current 74. thus recording the recording marks 71 on the optical disc 1, In the above description, the switch timing signal S is controlled so that the high frequency component 76 is superposed on the entire leading multi-pulse P1. The present invention is not limited to this. The switch timing signal S can be controlled so that the high frequency component 76 is superposed on a portion of the leading multi-pulse P1. Instead of generating overshoot or undershoot for the leading multi-pulse P1, overshoot or undershoot can be generated for a trailing multi-pulse or a heat-shielding pulse following the trailing multi-pulse based on the composition of the recording layer of the optical disc and the shape of the light spot, so that the recording characteristics of the recording marks can be improved. There can be cases where it is effective to generate overshoot or undershoot for all of the multi-pulses, and further there can be cases where the recording characteristics of the recording marks can be improved by blunting the shape of the pulses by attenuating the high frequency component included in the recording current enhanced by the current driving section 511.

In addition, the operation of the switch timing signal S can be adjusted based on the recording characteristics of the optical disc, so that overshoot or undershoot can be generated for a specific multi-pulse of the recording current which has a specific pattern. Specifically, the operation of the switch timing signal S is adjusted so as to superpose a high frequency component on the specific multi-pulse or attenuate a high frequency component in correspondence with the specific multi-pulse. The recording characteristics of the optical disc can be detected based on a reproduction signal using the recording characteristic detection section 51 (FIG. 1).

Hereinafter, the function and specific embodiments of the present invention for solving the above-described problems of the conventional art will be described.

With reference to FIG. 6, according to the present invention, the switching section 520 causes the filter 515 to operate so that the high frequency component 76 included in the recording current enhanced by the current driving section 511 is superposed on the leading multi-pulse P1 of the plurality of multi-pulses so as to generate overshoot. Therefore, the apparent temperature rise at a leading edge of the recording mark 71 is larger than that in the case where the high frequency component is not superposed on the leading multi-pulse and thus overshoot is not generated. Therefore, the inconvenience that the recording mark is tapered at the leading edge due to the insufficient temperature rise described above in the section entitled <Problem 1> is solved. As shown in FIG. 6, the recording mark 71 has a normal shape.

The phenomenon described above in the section entitled <Problem 2> that the recording mark is tapered at the leading edge when the linear velocity of the tracks of the optical disc fluctuates with respect to the optical pickup is also solved by the same function. Namely, the switching section 520 causes the filter 515 to operate so that the high frequency component 76 included in the recording current enhanced by the current driving section 511 is superposed on the leading multi-pulse P1 of the plurality of multi-pulses so as to generate overshoot. Therefore, the apparent temperature rise at a leading edge of the recording mark 71 is larger. Thus, the inconvenience that the recording mark is tapered at the leading edge due to the insufficient temperature rise is solved. The cut-off frequency FC and the impedance Z of the filter 515 can be set in accordance with the linear velocity of the optical disc with respect to the optical pickup.

The moving linear velocity of the recording layer, i.e., the linear velocity of the optical disc 1 (FIG. 1) with respect to the optical pickup 2A, is set by controlling the spindle motor 3 using a rotation speed control signal L from the linear velocity setting section 64 included in the central processing block 6A. The linear velocity of the optical disc 1 can be detected by the linear velocity detection section 63 included is the central processing block 6A based on a reproduction signal J output from the reproduction signal processing block 5A.

The present invention is not limited to this. The linear velocity of the optical disc 1 can alternatively be detected based on a rotation speed of the spindle motor 3 which is detected by a rotation speed detection section 77 (see FIG. 1). Still alternatively, the linear velocity of the optical disc 1 can be detected based on a radial position of the semiconductor laser 21 (included in the optical pickup 2A).on the optical disc 1 which is detected by a radial position detection section 7B (see FIG. 1). When the detected linear velocity is equal to or more than, or equal to or less than, a predetermined level, the switch timing signal S is controlled as described above with reference to FIG. 6. In this manner, the high frequency component 76 included in the recording current 74 enhanced by the current driving section 511 is superposed on the leading multi-pulse P1 among the plurality of multi-pulses, as a result of which overshoot is generated. Thus, the apparent temperature rise at the leading edge of the recording mark 71 is larger than that in the case where the high frequency component is not superposed on the leading multi-pulse and thus overshoot is not generated. This way, the phenomenon of the recording mark being tapered at the leading edge is alleviated.

Figure 7:
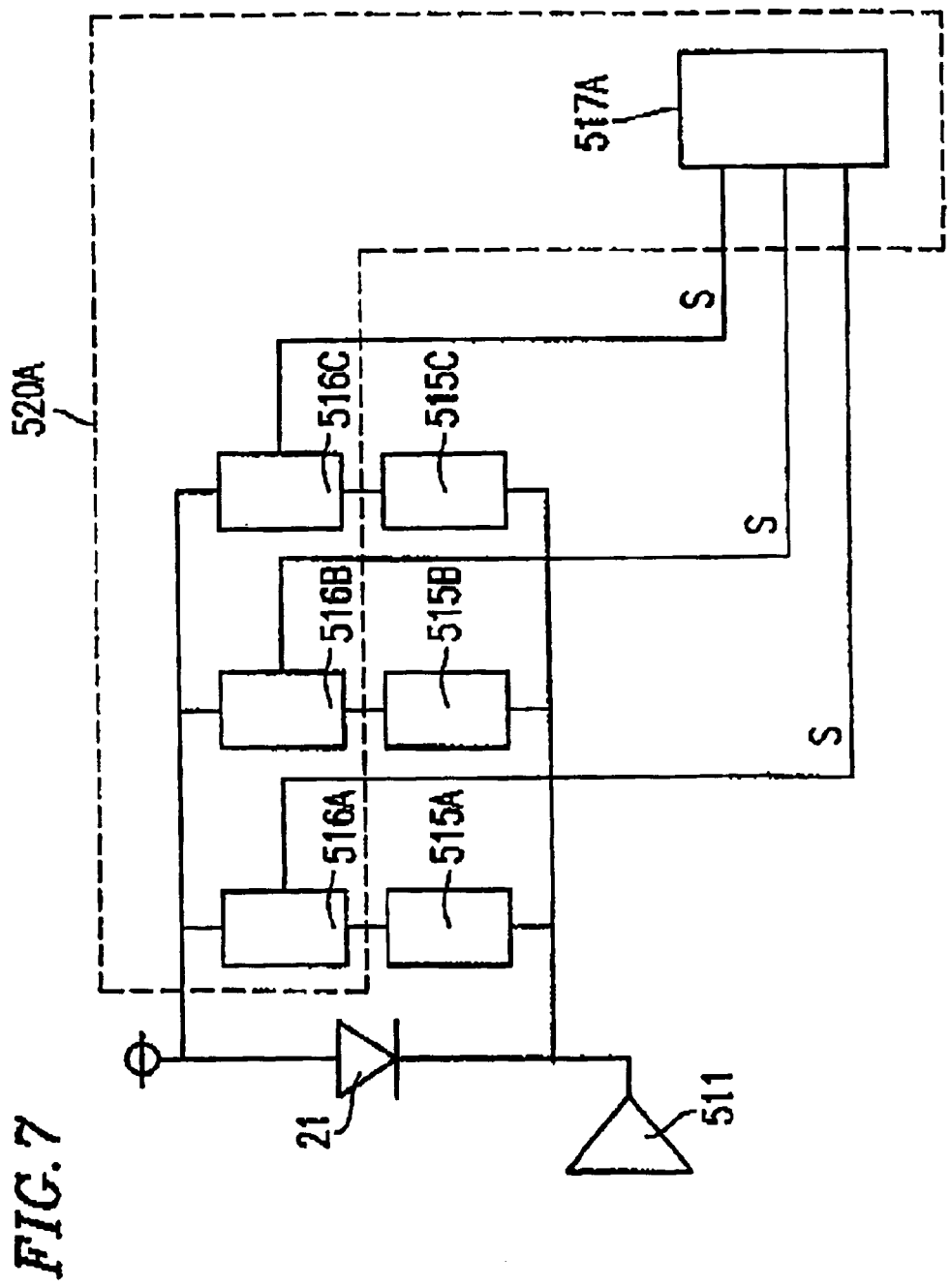
FIG. 7 is a schematic diagram illustrating another structure of a filter and components related thereto of a semiconductor laser driving apparatus according to the present invention.

FIG. 7 is a block diagram illustrating an alternative structure of a filter and components related thereto. As shown in FIG. 7, a plurality of filters (three filter circuits 515A, 515B and 515C are shown in FIG. 7) can be provided instead of the filter 515 (FIG. 3). A switching section 520 includes switches 516A, 516B and 516C respectively corresponding to the filter switches 515A, 515B and 515C, and a timing control section 517A.

In the case where the frequency characteristics and the impedance values of the three filter circuits 515A, 515D and 515C are different from one another, the following effects are provided.

In the case of an optical disc of a CAV system, the linear velocity of the optical disc with respect to the optical pickup varies in accordance with the radial position on the optical disc of the light directed to the optical disc by the semiconductor laser 21. Depending on whether the light from the semiconductor laser 21 is at a position in an inner portion, a central portion or an outer portion of the optical disc, one of the filter circuits 515A, 515B or 515C which has an optimum filter constant is operated. The one of the filter circuits 515A, 5153 or 515C is selected by respectively controlling the switches 516A, 516B and 516C so as to be on or off by the timing control section 517A. in this manner, a recording current having pulses optimum for the linear velocity of the inner, central or outer portion of the optical disc of the CAV system can be supplied to the semiconductor laser 21.

Figure 8:
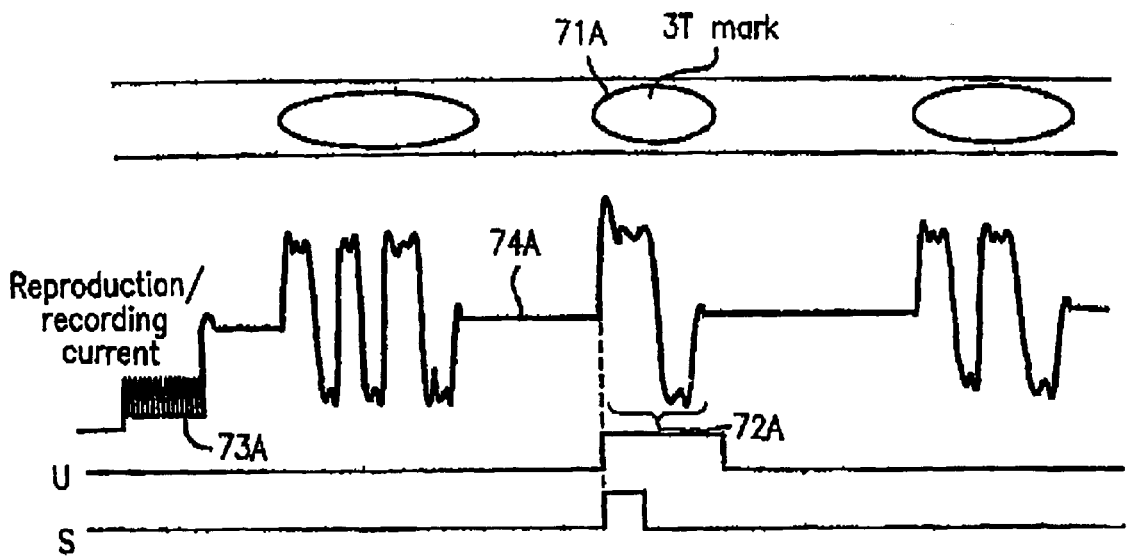
FIG. 8 is another timing diagram of control signals used for driving a semiconductor laser driving apparatus according to the present invention, Which also shows resulting recording pulses and recording marks.

<Problem 3> described above is also solved by the present invention. The cause of problem 3 is that the pulse width of the recording current for recording a 3T mark is too short to be supplied with a sufficient amount of heat. According to the present invention, as shown in FIG. 8, overshoot is generated at a pulse 72A for recording a 3T mark 71A, so that the amount of heat supplied to the 3T mark 71A is increased. Thus, the 3T mark 71A or a mark shorter than the other marks (e.g. 5T mark) can be stably recorded.

The amount of heat is adjusted is the following manner. First, a data pattern of the 3T mark 71A is detected by the data pattern detection section 41 (FIG. 1; 3T mark detection section) included in the recording signal processing block 4A. More specifically, the data pattern detection section 41 detects a data pattern for recording the 3T mark 71A from a series of modulated data patterns by means of pattern matching.

FIG. 8 shows a waveform of a data pattern detection signal U (3T pattern detection signal) for controlling the data pattern detection section 41 (FIG. 1), a waveform of a reproduction and recording current 73A for causing the semiconductor laser 21 to emit light, and a waveform of a switch timing signal S.

The data pattern detection section 41 detects the data pattern for recording the 3T mark 71A as described above. The switch timing signal S is switched to a high level at a timing fulfilling an AND condition of the 3T pattern detection signal and the peak power gate signal B (FIG. 3) (i.e., the condition by which both the 3T pattern detection signal and the peak power gate signal B are at a high level). Then, the switch 516 is placed in an open state. Overshoot occurs on the pulse 72A for recording the 31 mark 71A, thus increasing the total amount of heat to be supplied to the 3T mark 71A. Owing to the overshoot, even a recording mark which is shorter than the other recording marks can be stably recorded.

The above-mentioned effect is also provided for an entirety of a portion of a pulse, included in a recording current, having a specific pattern for recording marks including a 4T mark and a 5T mark, by causing overshoot to the entirety or the portion of such a pulse. A pulse having a specific pattern is also detected by the data pattern detection section 41.

Figure 9:
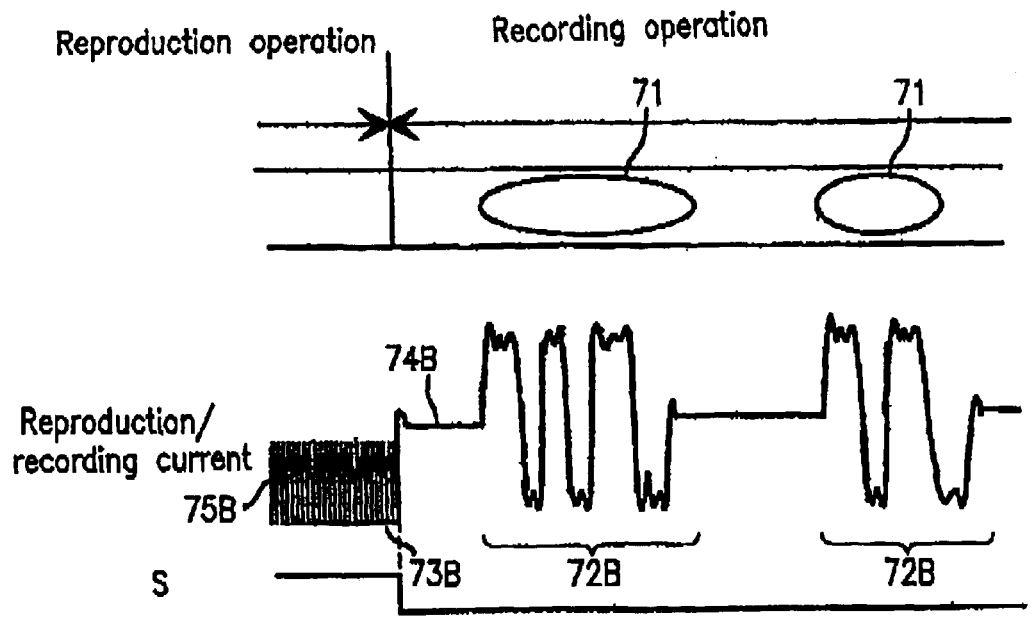
FIG. 9 is still another timing diagram of a control signal used for driving a semiconductor laser driving apparatus according to the present invention, which also shows resulting recording-pulses and recording marks.

<Problem 4> (i.e., the unnecessary radiation of high frequency noise to the outside of the semiconductor laser driving apparatus caused by the high frequency superposition) is solved by the switching the level of the switch timing signal S between a reproduction operation and a recording operation as shown in FIG. 9.

During the recording operation, the switch timing signal S is at a low level, and thus the switch 516 (FIG. 3.) is switched on. Accordingly, the filter 515 operates so as to attenuate the high frequency component included in the recording current enhanced by the current driving section 511. An a result, as shown in FIG. 9, a pulse 72B included in a recording current 74B is prevented from overshooting.

During the reproduction operation, the switch timing signal S is at a high level, and thus the switch 516 (FIG. 3) is switched off. Accordingly, the filter 515 does not operate so as to attenuate the high frequency component included in the recording current enhanced by the current driving section 511. As a result, the high frequency component included a high frequency current 75B enhanced by the current driving section 511 is supplied to the semiconductor laser 21 without being attenuated by the filter 515.

As described above, the high frequency current 75B can be supplied to the semiconductor laser 21 without deteriorating the amplitude of the high frequency component included in the high frequency current 75B at the time of reproduction. Since the high frequency component is not attenuated, the high frequency current generation section 519 can generate the high frequency current 75B having a smaller amplitude. Then, the radiation of high frequency noise to the outside of the semiconductor laser driving apparatus which is caused by the high frequency current 75B is reduced.

In addition, the high frequency component included in the high frequency current 75B to be superposed on a reproduction current 73B supplied to the semiconductor laser 21 is increased by the amount which is prevented from being attenuated. Therefore, the semiconductor laser noise NL generated in the semiconductor laser 21 is reduced. This contributes to improvement in the signal-to-noise ratio of a reproduction signal obtained as a result of high density recording.

Figure 10:
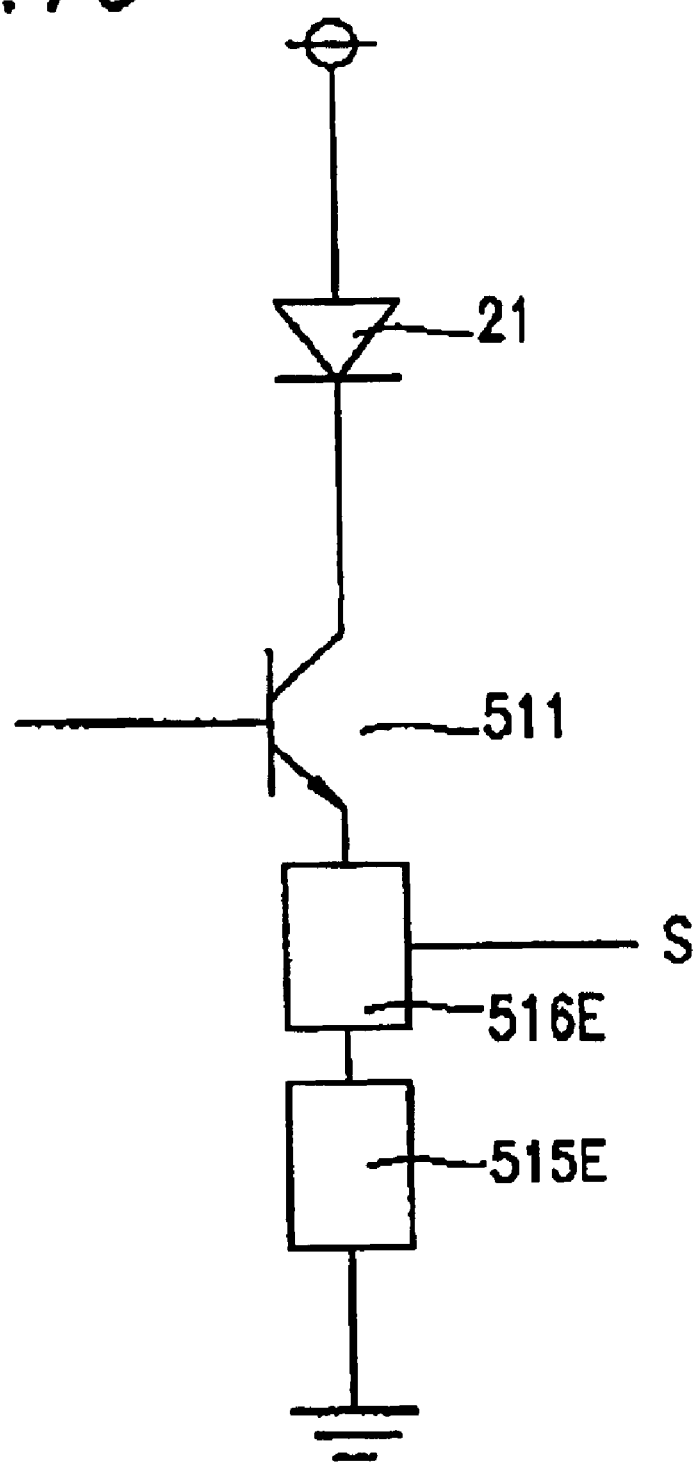
FIG. 10 is a schematic diagram illustrating still another structure of a filter and components related thereto of a semiconductor laser driving apparatus according to the present invention.
Figure 11A:
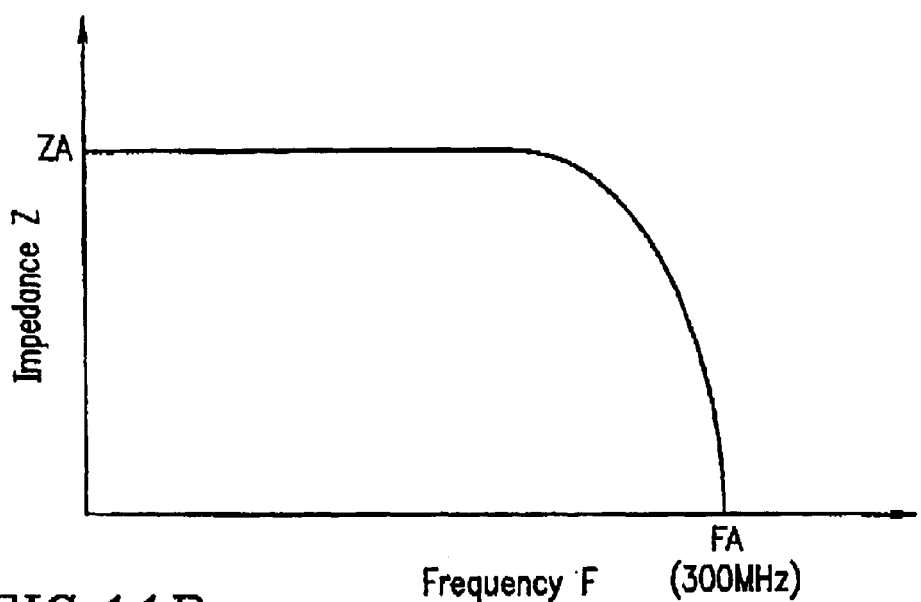
FIG. 11A is a graph illustrating a frequency characteristic of the filter shown in FIG. 10.

In the above description, the current driving section 511 has a frequency characteristic which enhances the high frequency component. There are cases where the current driving section 511 cannot be provided with Such a frequency characteristic due to restriction on design thereof. In such cases, the filter 515 and the switching section 520 shown in FIG. 3 can be replaced with, for example, the structure shown in FIG. 10, A filter 515E shown in FIG. 10 has a frequency characteristic (relationship between the impedance Z and the frequency F) shown in FIG. 11A. As shown in FIG. 11A, the filter 515E has a sufficiently low impedance Z at the frequency FA (high frequency superposition frequency of 300 MHz). Owing to the structure shown in FIG. 10, the filter 515E becomes active when a switch 516E is switched on and operates as follows. At the time of reproduction, the filter 515E operates to enhance the high frequency component included in the high frequency current generated by the high frequency current generation section 519 (FIG. 3). At the time of recording, the filter 515E operates to enhance the high frequency component included in the recording current generated by the recording and reproduction current generation section 518. The amplitude of the high frequency component of 300 MHz supplied to the semiconductor laser 21 can be efficiently supplied with the high frequency component.

Figure 13:
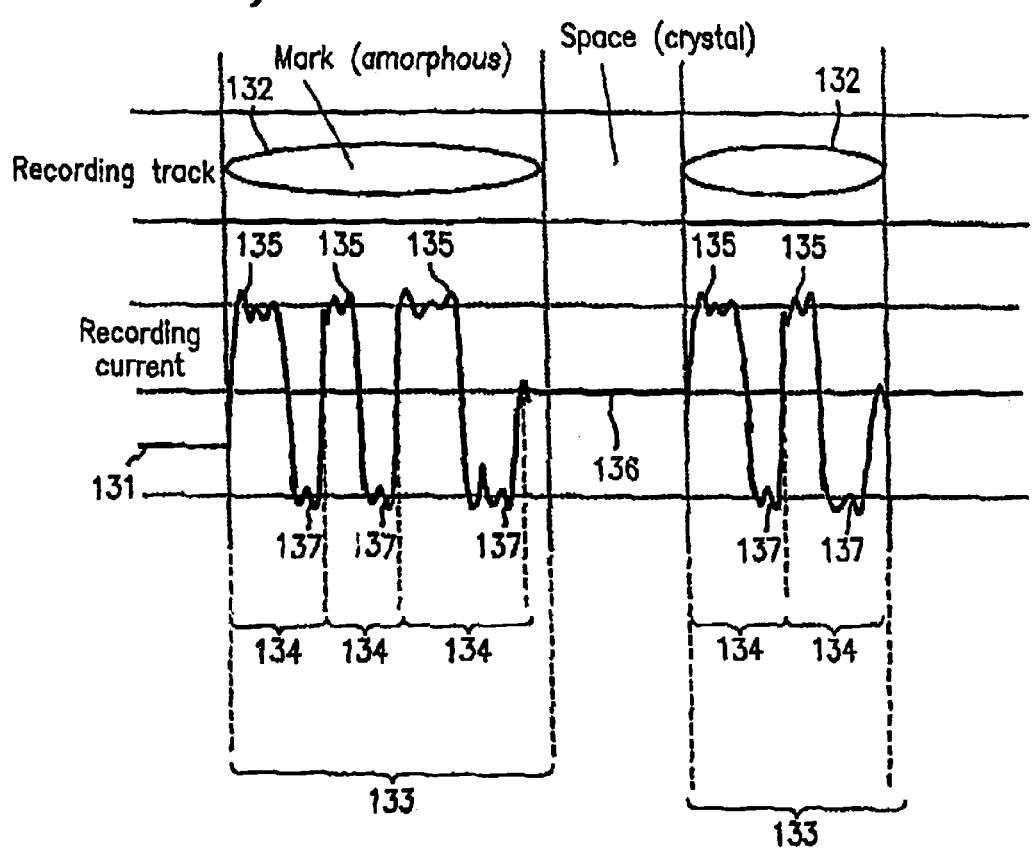
FIG. 13 shows recording marks and a waveform of recording pulses in a conventional semiconductor laser driving apparatus.
Figure 14:
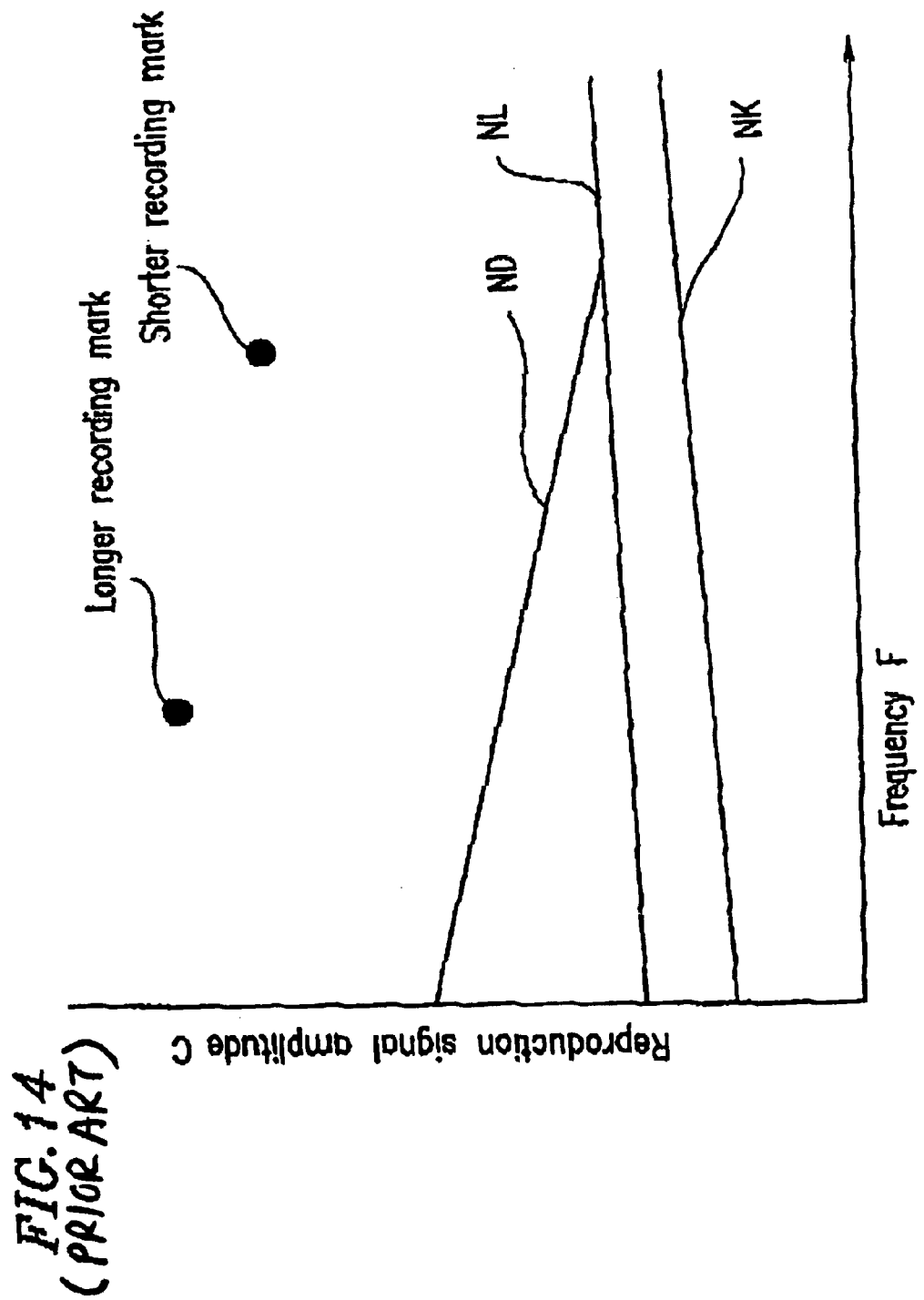
FIG. 14 is a graph illustrating a frequency characteristic of a carrier signal and noise components when recording on an optical disc is performed.

The semiconductor laser driving current noise NK described above in the section entitled <Problem 2> specifically includes circuit noise generated in the semiconductor laser driving apparatus and noise superposed on the driving current (recording current or reproduction current) by an external factor from the outside of the semiconductor laser driving apparatus. Since the semiconductor laser driving current noise NK influences a signal band of 20 MHz or lower, the noise component in the signal band of 20 MHz or lower needs to be sent to the filter efficiently. This requires a filter having a frequency characteristic of also passing a signal of 20 MHz or lower as shown in FIG. 13B. However, the filter should not pass a signal of about 100 kHz or lower, since such a signal is used for servo control.

Figure 12:
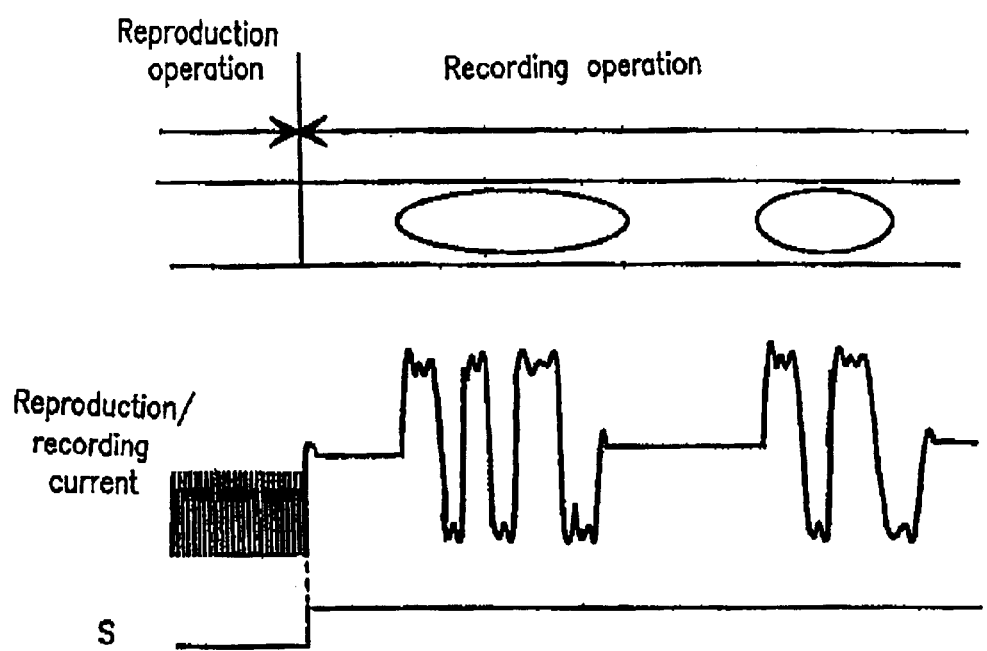
FIG. 12 is still another timing diagram of a control signal used for driving a semiconductor laser driving apparatus according to the present invention, which also shows resulting recording pulses and recording marks.

When a filter for passing a signal of 20 MHz or lower is used, the edges of the pulses included in the recording current are blunted. Therefore, accurate recording may not be realized. As shown in FIG. 12. a switch timing signal S is used to place the filter in an open state at the time of recording.

Figure 11B:
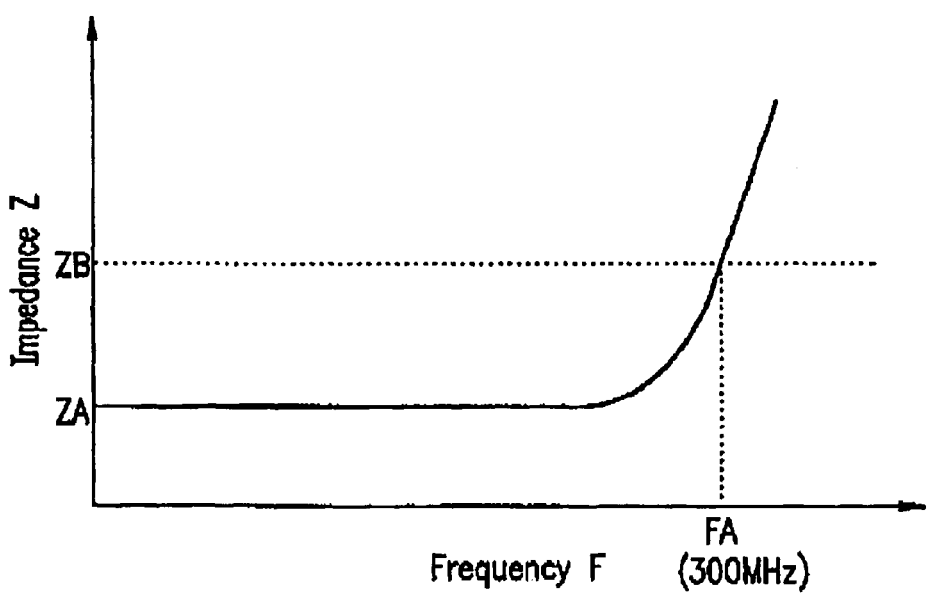
FIG. 11B is a graph illustrating a frequency characteristic of another filter usable in a semiconductor laser driving apparatus according to the present invention.

A filter having a frequency characteristic shown in FIG. 11B suppresses the noise in a band of 20 MHz or lower during a reproduction operation, but also undesirably suppresses a high frequency superposition signal of 300 MHz, which is necessary for reproduction. Therefore, the filter having a frequency characteristic shown in FIG. 11B may not contribute to suppression of the semiconductor laser noise NL generated in the semiconductor laser 21. In consideration of this, it is desirable to use a filter having a structure shown in FIG. 3 and having a frequency characteristic shown in FIG. 11B in combination with a filter having a structure shown in FIG. 10 and having a frequency characteristic shown in FIG. 11A. Such a combination provides a frequency characteristic having a sufficiently low impedance (ZA) in a signal brand of 20 MHz or lower and having a sufficiently high impedance to allow a high frequency current to be superposed on a driving current of the semiconductor laser at a high frequency superposition frequency of 300 MHz.

The specific design the filters 515, 515A, 515B, 515C and 515E in terms of frequency characteristics; the positioning of the filters 515, 515A, 5155, 515C and 515E and the switching sections 520 and 520A in the semiconductor laser 21; and setting of the switching timing by the switching sections 520 and 520A can be determined in accordance with various parameters of the system and are not limited to the above-mentioned examples. When the semiconductor laser driving apparatus includes a plurality of filters 515A, 515B and 515C and the switching section 520A, the circuits in the semiconductor laser driving apparatus can be appropriately changed so that the plurality of filters can be arbitrarily switched and combined as necessary.

As described above, the present invention provides a semiconductor laser driving apparatus for providing stable recording characteristics at a high recording density and a high signal-to-noise ratio of a reproduction signal at the time of reproduction, and an optical disc apparatus including such a semiconductor laser driving apparatus.

The present invention provides a semiconductor laser driving apparatus capable of recording a recording mark having a normal shape even when the composition of the optical disc is not uniform, and an optical disc apparatus including such a semiconductor laser driving apparatus.

The present invention provides a semiconductor laser driving apparatus capable of recording a recording mark having a normal shape even when the linear velocity of the optical disc fluctuates at the time of recording, and an optical disc apparatus including ouch a semiconductor laser driving apparatus.

The present invention provides a semiconductor laser driving apparatus capable of recording a stable 3T mark having a normal shape, and an optical disc apparatus including such a semiconductor laser driving apparatus.

The present invention provides a semiconductor laser driving apparatus capable of reducing unnecessary radiation of high frequency noise to the outside of the semiconductor laser driving apparatus caused by a high frequency current, and an optical disc apparatus including such a semiconductor laser driving apparatus.

The present invention provides a semiconductor laser driving apparatus capable of avoiding excessive overshoot or undershoot at the rise or fall of the recording current at the time of recording even when a current driving section is provided with a frequency peak in order to enhance the high frequency component included in the high frequency current at the time of reproduction, and an optical disc apparatus including such a semiconductor laser driving apparatus.

The present invention provides a semiconductor laser driving apparatus capable of preventing the pulses of the recording current from being blunted at the time of recording even when a low pass fitter is provided for reducing the level of noise in the reproduction signal at the time of reproduction, and an optical disc apparatus including such a semiconductor laser driving apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser driving apparatus for driving a semiconductor laser for directing light to an optical disc for recording a recording mark on the optical disc based on a recording current and reproducing the recording mark recorded on the optical disc so as to generate a reproduction signal, the semiconductor laser driving apparatus comprising:

a reproduction current generation section for generating the reproduction current;

a high frequency current generation section for generating a high frequency current including a high frequency component for reducing semiconductor laser noise included in the reproduction;

a recording current generation section for generating the recording current, the recording current including a pulse corresponding to the recording mark and the pulse including a plurality of multi-pulses; and a current driving section for amplifying the reproduction current and the recording current, wherein the high frequency component included in the high frequency current generated by the high frequency current generation section is enhanced at the time of reproduction, and the high frequency component included in the recording current generated by the recording current generation section is enhanced at the time of recording, the semiconductor laser driving apparatus further comprising:

a filter for operating so as to attenuate the enhanced high frequency component included in the high frequency current generated by the high frequency current generation section and the enhanced high frequency component included in the recording current generated by the recording current generation section; and a switching section for switching the filter on or off so that the enhanced high frequency component included in the recording current is superposed on at least one of the plurality of multi-pulses included in the pulse of the recording current based on a linear velocity of the optical disc.

2. A semiconductor laser driving apparatus according to claim 1, wherein the current driving section has a frequency characteristic for enhancing the high frequency component, and the current driving section enhances the high frequency component included in the high frequency current generated by the high frequency current generation section at the time of reproduction and enhances the high frequency component included in the recording current generated by the recording current generation section at the time of recording.

3. A semiconductor laser driving apparatus according to claim 1, wherein the switching section includes a switch connected to the filter and a timing control section for controlling the timing of opening or closing of the switch.

4. A semiconductor laser driving apparatus according to claim 1, wherein the at least one of the plurality of multi-pulses includes a leading multi-pulse.

5. A semiconductor laser driving apparatus according to claim 1, wherein the pulse includes a specific pulse having a specific pattern, and the switching section causes the filter to operate so that the enhanced high frequency component included in the recording current is superposed on the specific pulse.

6. A semiconductor laser driving apparatus according to claim 5, wherein:

the recording mark includes a 3T mark recorded by 8–16 modulation, the specific pulse includes a 3T pulse corresponding to the 3T mark, and the switching section causes the filter to operate so that the enhanced high frequency component included in the recording current is superposed on the 3T pulse.

7. A semiconductor laser driving apparatus according to claim 1, wherein the switching section causes the filter to operate so that the enhanced high frequency component included in the recording current is superposed on a portion of at least one of the plurality of multi-pulses included in the pulse.

8. A semiconductor laser driving apparatus according to claim 1, wherein the switching section causes the filter to operate so that the enhanced high frequency component included in the recording current is superposed on an entirety of at least one of the plurality of multi-pulses included in the pulse.

9. A semiconductor laser driving apparatus according to claim 1, wherein the at least one of the plurality of multi-pulses includes a trailing multi-pulse.

10. A semiconductor laser driving apparatus according to claim 1, wherein the switching section causes the filter to operate so that the enhanced high frequency component included in the recording current is superposed on all of the plurality of multi-pulses included in the pulse.

11. A semiconductor laser driving apparatus according to claim 1, wherein the reproduction current is a DC current.

12. A semiconductor laser driving apparatus according to claim 1, wherein the switching section causes the filter to operate so that the enhanced high frequency component included in the high frequency current is superposed on the reproduction current at the time of reproduction, and causes the filter to operate so that the enhanced high frequency component included in the recording current is attenuated at the time of recording.

13. A semiconductor laser driving apparatus according to claim 1, wherein the high frequency component has a frequency of 100 MHz or higher.

14. A semiconductor laser driving apparatus according to claim 13, wherein the high frequency component has a frequency of 100 MHz or higher and 450 MHz or lower.

15. A semiconductor laser driving apparatus according to claim 1, wherein the high frequency component has a frequency of substantially 300 MHz.

16. A semiconductor laser driving apparatus according to claim 1, wherein the filter includes a high pass filter.

17. A semiconductor laser driving apparatus according to claim 1, wherein the high frequency component has a frequency which is higher than a cut-off frequency of the filter.

18. An optical disc apparatus, comprising:
  an optical pickup for recording a recording mark on an optical disc and reproducing the recording mark recorded on the optical disc;
  a motor for rotating the optical disc; and
  a control block for controlling the optical pickup and the motor,
  wherein:
  the optical pickup includes:
    a semiconductor laser for directing light to the optical disc for recording the recording mark on the optical disc based on a recording current and reproducing the recording mark recorded on the optical disc so as to generate a reproduction signal, and
    a semiconductor laser driving apparatus for driving the semiconductor laser, the semiconductor laser driving apparatus including:
      a reproduction current generation section for generating the reproduction current,
      a high frequency current generation section for generating a high frequency current including a high frequency component for reducing a semiconductor laser noise included in the reproduction signal,
      a recording current generation section for generating the recording current, the recording current including a pulse corresponding to the recording mark and the pulse including a plurality of multi-pulses, and
      a current driving section for amplifying the reproduction current and the recording current,
      wherein the high frequency component included in the high frequency current generated by the high frequency current generation section is enhanced at the time of reproduction, and the high frequency component included in the recording current generated by the recording current generation section is enhanced at the time of recording,
    the semiconductor laser driving apparatus further comprising:
      a filter for operating so as to attenuate the high frequency component included in the high frequency current generated by the enhanced high frequency current generation section and the enhanced high frequency component included in the recording current generated by the recording current generation section, and
      a switching section for switching the filter on or off so that the enhanced high frequency component included in the recording current is superposed on at least one of the plurality of multi-pulses included in the pulse of the recording current,
  wherein the control block includes a linear velocity detection section for detecting a linear velocity of the optical disc, and
  wherein the switching section causes the filter to operate so that the enhanced high frequency component included in the recording current is superimposed on at least one of the plurality of multi-pulses included in the pulse based on the linear velocity of the optical disc.

19. An optical disc apparatus according to claim 18, wherein the current driving section has a frequency characteristic for enhancing the high frequency component, and the current driving section enhances the high frequency component included in the high frequency current generated by the high frequency current generation section at the time of reproduction and enhances the high frequency component included in the recording current generated by the recording current generation section at the time of recording.

20. An optical disc apparatus according to claim 18, wherein the linear velocity detection section detects the linear velocity of the optical disc based on the reproduction signal.

21. An optical disc apparatus according to claim 18, wherein the linear velocity detection section detects the linear velocity of the optical disc based on a rotation speed of the motor.

22. An optical disc apparatus according to claim 18, wherein the linear velocity detection section detects the linear velocity of the optical disc based on a radial position of the optical pickup on the optical disc.

* * * * *